US009122896B2

(12) United States Patent
Ohnuki

(10) Patent No.: US 9,122,896 B2
(45) Date of Patent: *Sep. 1, 2015

(54) ADDER

(71) Applicant: Semiconductor Energy Laboratory Co., Ltd., Atsugi-shi, Kanagawa-ken (JP)

(72) Inventor: Tatsuya Ohnuki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/162,812

(22) Filed: Jan. 24, 2014

(65) Prior Publication Data

US 2014/0191791 A1    Jul. 10, 2014

Related U.S. Application Data

(63) Continuation of application No. 13/472,733, filed on May 16, 2012, now Pat. No. 8,638,123.

(30) Foreign Application Priority Data

May 20, 2011   (JP) ................. 2011-114035

(51) Int. Cl.
*H03K 19/094* (2006.01)
*H03K 17/00* (2006.01)
*G06G 7/14* (2006.01)
(Continued)

(52) U.S. Cl.
CPC .. *G06G 7/14* (2013.01); *G06F 1/32* (2013.01); *G06F 7/485* (2013.01)

(58) Field of Classification Search
None
See application file for complete search history.

(56) References Cited

U.S. PATENT DOCUMENTS 3,775,693 A    11/1973   Proebsting
4,800,303 A     1/1989   Graham et al.
(Continued)

FOREIGN PATENT DOCUMENTS

EP    1 737 044 A1    12/2006
EP    2 226 847 A2     9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Jany Richardson
(74) *Attorney, Agent, or Firm* — Fish & Richardson P.C.

(57) ABSTRACT

A circuit in which a storage function and an arithmetic function are combined is proposed by using a transistor with low off-state current for forming a storage element. When the transistor with low off-state current is used, electric charge can be held, for example, in a node or the like between a source or a drain of the transistor with low off-state current and a gate of another transistor. Thus, the node or the like between one of the source or the drain of the transistor with low off-state current and the gate of the another transistor can be used as a storage element. In addition, leakage current accompanied by the operation of an adder can be reduced considerably. Accordingly, a signal processing circuit consuming less power can be formed.

23 Claims, 30 Drawing Sheets

(51) Int. Cl.
*G06F 1/32* (2006.01)
*G06F 7/485* (2006.01)

(56) References Cited

U.S. PATENT DOCUMENTS

| | | |
|---|---|---|
| 5,039,883 A | 8/1991 | On |
| 5,528,032 A | 6/1996 | Uchiyama |
| 5,731,856 A | 3/1998 | Kim et al. |
| 5,744,864 A | 4/1998 | Cillessen et al. |
| 5,980,092 A | 11/1999 | Merryman et al. |
| 6,049,883 A | 4/2000 | Tjandrasuwita |
| 6,078,194 A | 6/2000 | Lee |
| 6,084,437 A * | 7/2000 | Sako ............................ 326/113 |
| 6,204,695 B1 | 3/2001 | Alfke et al. |
| 6,281,710 B1 | 8/2001 | Poirier et al. |
| 6,294,274 B1 | 9/2001 | Kawazoe et al. |
| 6,479,329 B2 | 11/2002 | Nakajima et al. |
| 6,563,174 B2 | 5/2003 | Kawasaki et al. |
| 6,573,754 B2 | 6/2003 | Menczigar et al. |
| 6,727,522 B1 | 4/2004 | Kawasaki et al. |
| 6,822,478 B2 | 11/2004 | Elappuparackal |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,076,748 B2 | 7/2006 | Kapoor et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,582 B2 | 8/2009 | Lee et al. |
| 7,674,650 B2 | 3/2010 | Akimoto et al. |
| 7,732,819 B2 | 6/2010 | Akimoto et al. |
| 2001/0013796 A1 | 8/2001 | Li et al. |
| 2001/0046027 A1 | 11/2001 | Tai et al. |
| 2002/0036529 A1 | 3/2002 | Furusawa et al. |
| 2002/0056838 A1 | 5/2002 | Ogawa |
| 2002/0132454 A1 | 9/2002 | Ohtsu et al. |
| 2003/0036529 A1 | 2/2003 | Christianson et al. |
| 2003/0129853 A1 | 7/2003 | Nakajima et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0038582 A1 | 2/2006 | Peeters |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119394 A1 | 6/2006 | Dronavalli |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0024318 A1 | 2/2007 | Mamidipaka |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0161165 A1 | 7/2007 | Liu et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0206959 A1 | 8/2008 | Takayama et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0027083 A1 | 1/2009 | Kimura et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256784 A1 | 10/2009 | Ahn |
| 2009/0278122 A1 | 11/2009 | Hosono et al. |
| 2009/0280600 A1 | 11/2009 | Hosono et al. |
| 2009/0310734 A1 | 12/2009 | Umezki |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062992 A1 | 3/2011 | Okazaki et al. |
| 2011/0069047 A1 | 3/2011 | Koyama et al. |
| 2011/0084731 A1 | 4/2011 | Kawae |
| 2011/0089975 A1 | 4/2011 | Yamazaki et al. |
| 2011/0090184 A1 | 4/2011 | Yamazaki et al. |
| 2011/0101332 A1 | 5/2011 | Yamazaki et al. |
| 2011/0102018 A1 | 5/2011 | Shionoiri et al. |
| 2011/0121878 A1 | 5/2011 | Kato et al. |
| 2011/0156027 A1 | 6/2011 | Yamazaki et al. |
| 2011/0285372 A1 | 11/2011 | Takahashi et al. |
| 2011/0285426 A1 | 11/2011 | Takahashi et al. |
| 2011/0285442 A1 | 11/2011 | Saito |
| 2012/0032785 A1 | 2/2012 | Kamata |
| 2012/0051117 A1* | 3/2012 | Yamazaki et al. ............ 365/149 |
| 2012/0057396 A1 | 3/2012 | Yamazaki et al. |
| 2012/0293210 A1* | 11/2012 | Yakubo et al. ................ 326/103 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—$ZnO$ system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Fukumoto, Eri et al.; "High Mobility Oxide Semiconductor TFT for Circuit Integration of AM-OLED"; IDW '10 : Proceedings of the 16th International Display Workshops; Dec. 1, 2010; pp. 631-634.

Takahiro Hanyu; "Logic Integrated Circuit using Tunneling-Magnetoresistive Devices—Next-generation logic LSI paradigm using nonvolatile devices-"; JSAP(The Japan Society of Applied Physics); Dec. 1, 2007; pp. 1388-1393; vol. 76, No. 12; Oyobuturi, with English translation.

Ikeda, Shoji et al.; "Magnetic Tunnel Junctions for Spintronic Memories and Beyond"; IEEE Transactions on Electron Devices; May 1, 2007; pp. 991-1002; vol. 54, No. 5.

* cited by examiner charge 0 charge +1 charge 0 charge −1 charge 0

FIG. 19A
FIG. 19B
FIG. 19C
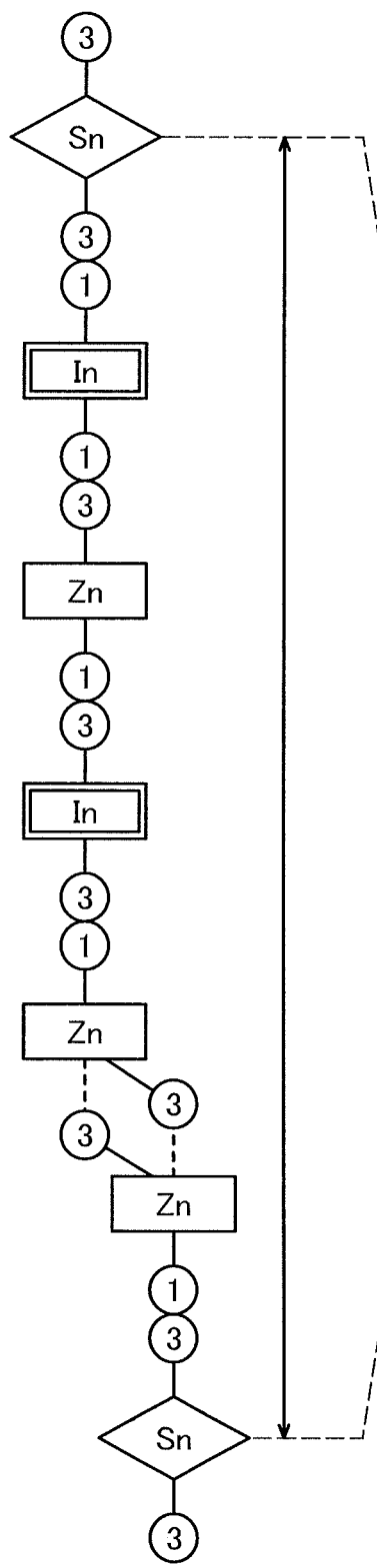
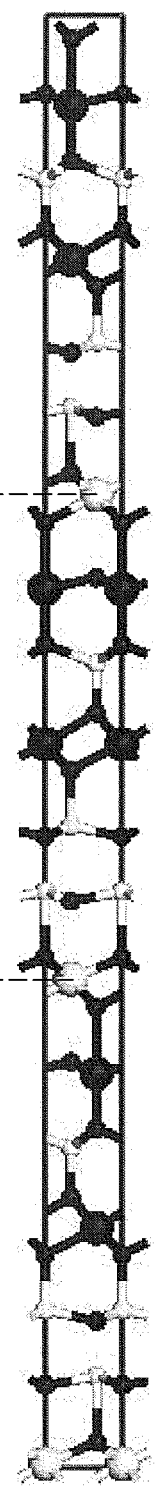
● In
○ Sn
○ Zn
● O

● In
○ Ga
○ Zn
● O

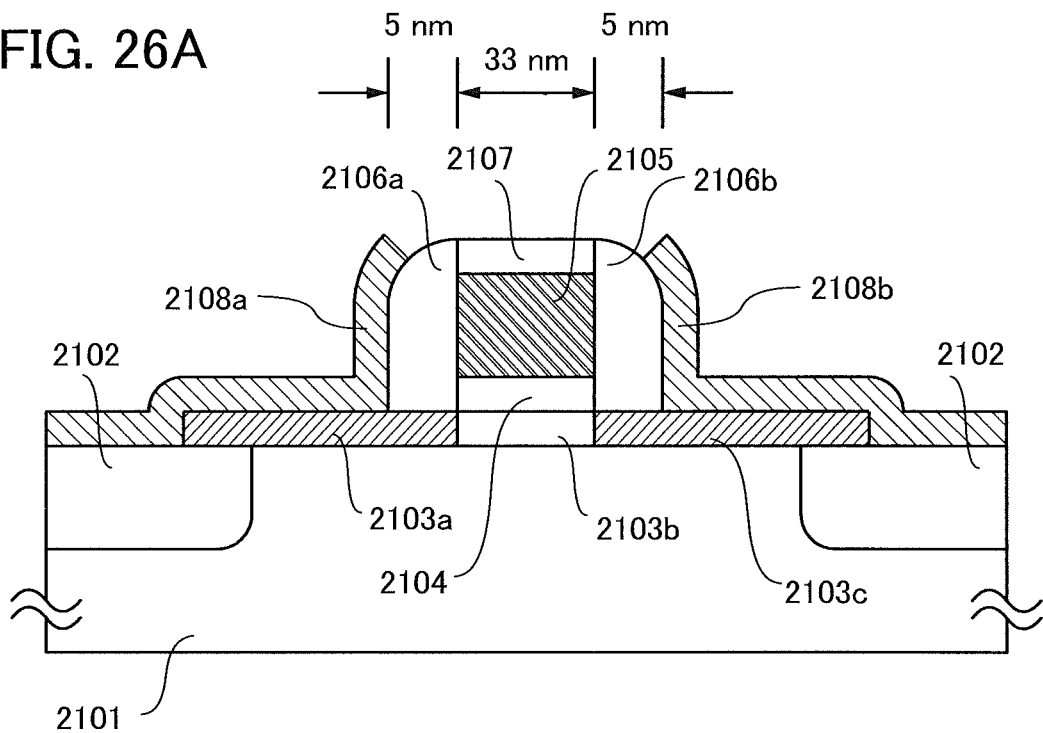
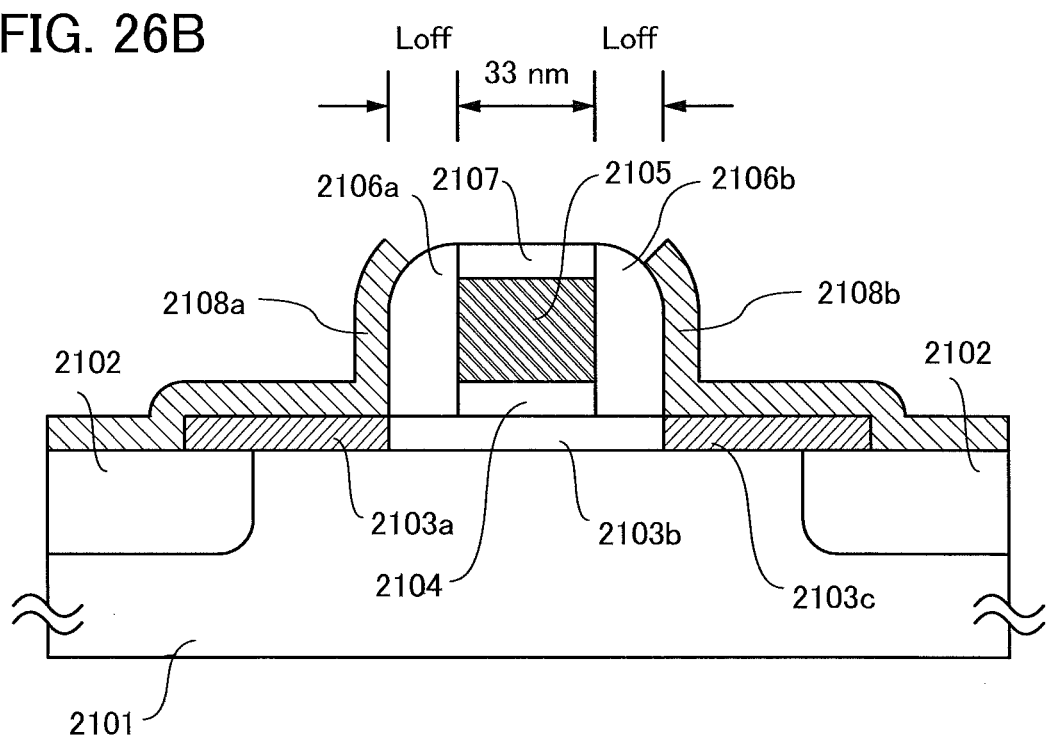

ADDER

CROSS-REFERENCE TO RELATED APPLICATIONS

This application is a continuation of U.S. application Ser. No. 13/472,733, filed May 16, 2012, now allowed, which claims the benefit of a foreign priority application filed in Japan as Serial No. 2011-114035 on May 20, 2011, both of which are incorporated by reference.

BACKGROUND OF THE INVENTION

1. Field of the Invention

The present invention relates to adders. Further, the present invention relates to a signal processing circuit including a nonvolatile storage function and electronic devices including the signal processing circuit.

2. Description of the Related Art

In silicon semiconductor integrated circuits whose high integration and high performance are progressing, a significant increase in power consumption, in particular, static power consumption in a standby mode of the integrated circuits has been problematic. There is a method of using a nonvolatile memory such as a flash memory besides a volatile memory such as a DRAM or an SRAM in order to reduce the static power consumption in a silicon integrated chip. In this method, unnecessary power consumption can be suppressed by saving data in the nonvolatile memory and turning off the power when the integrated circuit is in a standby mode. However, a flash memory needs a high voltage and a long writing and reading time to save and return data.

To solve this problem, for example, a logic-in-memory architecture in which a storage function and an arithmetic function are combined using a Tunneling Magnetororesistive (TMR) element as a storage element is described in Non-Patent Document 1. Power consumption accompanied by saving and returning data can be reduced by employing the logic-in-memory architecture using a TMR element as a storage element. In the Non-Patent Document 1, a full adder including 24 transistors, 2 capacitors, and 4 TMR elements is described as a full adder using TMR elements.

REFERENCE

[Non-Patent Document] Ikeda et al, "Magnetic Tunnel Junctions for Spintronic Memories and Beyond", *IEEE TRANSACTIONS ON ELECTRON DEVICES*, vol. 54, no. 5, pp. 991-1002, 2007.

SUMMARY OF THE INVENTION

With development of portable information devices and demand for energy saving, a signal processing circuit consuming less power has been required. However, in the logic-in-memory architecture including a TMR element, the TMR element consumes a large amount of power and there is a limit in reducing the power consumption of the entire signal processing circuit.

Thus, an object of one embodiment of the present invention is to provide a novel logic-in-memory architecture. Another object of one embodiment of the present invention is to provide a signal processing circuit having a novel logic-in-memory architecture and consuming less power. Still another object of one embodiment of the present invention is to provide an electronic device including the signal processing circuit and consuming less power.

In order to achieve such objects, according to one embodiment of the present invention, a circuit in which a storage function and an arithmetic function are combined using a transistor with extremely low off-state current (typically, a transistor including an oxide semiconductor with extremely low off-state current) for forming a storage element is proposed.

When the transistor with extremely low off-state current is used, electric charge can be held, for example, in a node between a source or a drain of the transistor with extremely low off-state current and a gate of another transistor. Thus, the node between the source or the drain of the transistor with extremely low off-state current and the gate of another transistor or the like can be used as a storage element. In addition, leakage current accompanied by the operation of an adder can be reduced considerably. Accordingly, a signal processing circuit consuming less power can be formed.

According to one embodiment of the present invention, a novel logic-in-memory architecture can be provided. In addition, a signal processing circuit having a novel logic-in-memory architecture and consuming less power can be provided. Further, an electronic device including the signal processing circuit and consuming less power can be provided.

BRIEF DESCRIPTION OF THE DRAWINGS

FIGS. 19A to 19C illustrate a crystal structure of an oxide semiconductor.

FIGS. 26A and 26B each illustrate a cross-sectional structure of a transistor used for calculation.

DETAILED DESCRIPTION OF THE INVENTION

Figure 1:
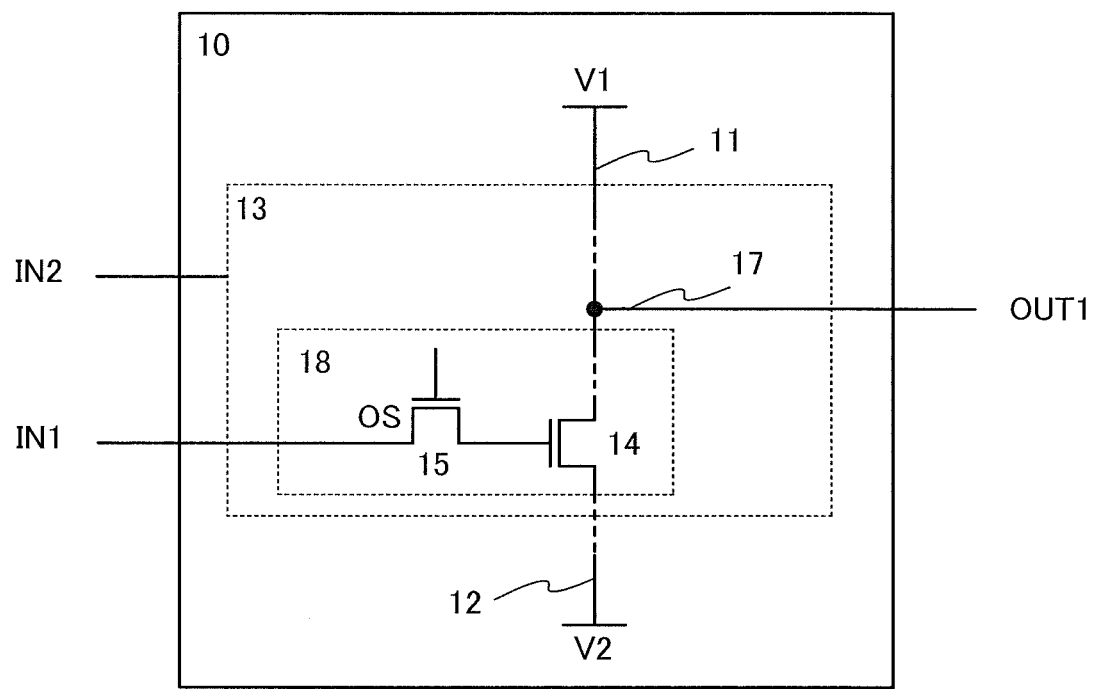
FIG. 1 is a block diagram of an adder.

Embodiments of the present invention will be described below with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that the term "electrically connected" includes the case where components are connected through an "object having any electric function". There is no particular limitation on an object having any electric function as long as electric signals can be transmitted and received between components that are connected through the object.

In addition, even when independent components are electrically connected to each other in a circuit diagram, there is the case where one conductive film has functions of a plurality of components, such as the case where part of a wiring functions as an electrode or a terminal. The "electrical connection" in this specification includes in its category such a case where one conductive film has functions of a plurality of components.

The terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

As a transistor with extremely low off-state current, a transistor with off-state current lower than or equal to 1 fA/μm, preferably lower than or equal to 1 aA/μm, more preferably lower than or equal to 1 zA/μm at room temperature can be used. Such a transistor with extremely low off-state current can be achieved by applying a transistor whose channel is formed in an oxide semiconductor layer, which is hereinafter referred to as a transistor including an oxide semiconductor.

In some circuit diagrams, a transistor with extremely low off-state current is denoted by "OS". In the following description, a transistor with extremely low off-state current is denoted by "OS" when it is used, and a transistor which is not particularly specified is regarded as a transistor other than the transistor with extremely low off-state current. As the transistor other than the transistor with low off-state current, a transistor capable of high-speed operation can be used. As an example of the transistor capable of high-speed operation, a silicon transistor whose channel is formed in a silicon layer can be given.

In addition, a low potential and a high potential of each of signals input and output to/from a signal processing circuit are data 0 and data 1, respectively. In the following description, a p-channel transistor is specified, and a transistor which is not particularly specified is regarded as an n-channel transistor. Note that, for example, which conductivity type of a channel of a transistor is used or whether signals related to arithmetic is inverted or not can be decided as appropriate. For example, a circuit may be formed in a manner such that the conductivity types of channels of some transistors are exchanged and an inverted signal is input to a gate of the transistor whose channel has an exchanged conductivity type. Further, an inverter or the like may be provided as appropriate to generate an inverted signal.

Embodiment 1

In this embodiment, an example of an adder according to one embodiment of the present invention will be described with reference to FIG. 1, FIG. 2, FIGS. 3A to 3C, FIGS. 4A to 4C, FIG. 5, FIG. 6, FIG. 7, FIG. 8, and FIG. 9. An adder is a signal processing circuit that calculates a sum which is a result of adding one-bit binary numbers and whether a carry is generated. Note that there are a semi-adder and a full adder as an adder. The half adder is a signal processing circuit which does not take into account a carry from a low-order bit, and a full adder is a signal processing circuit which takes into account a carry from a low-order bit.

<Block Diagram of Adder>

FIG. 1 is a block diagram of a sum or carry circuit 10 which is part of an adder. The adder adds a plurality of binary input signals and outputs arithmetic results. The sum or carry circuit 10 is a part of the adder, which is related to either arithmetic of a sum or arithmetic of a carry. A truth table of the adder is shown in Table 1.

TABLE 1

|      | X | A | B | Sum | Carry |
|------|---|---|---|-----|-------|
| p_0  | 0 | 0 | 0 | 0   | 0     |
| p_1  | 0 | 1 | 0 | 1   | 0     |
| p_2  | 1 | 0 | 0 | 1   | 0     |
| p_3  | 0 | 0 | 1 | 1   | 0     |
| p_4  | 1 | 1 | 0 | 0   | 1     |
| p_5  | 0 | 1 | 1 | 0   | 1     |
| p_6  | 1 | 0 | 1 | 0   | 1     |
| p_7  | 1 | 1 | 1 | 1   | 1     |

In the sum or carry circuit 10 in FIG. 1, any one of input signals X, A, and B in Table 1 is an input signal IN1. Any one of the input signals X, A, and B which is different from the input signal IN1 is an input signal IN2. Any one of output signals Carry and Sum is an output signal OUT1.

As illustrated in FIG. 1, the sum or carry circuit 10 includes a wiring 11 for supplying a potential V1, a wiring 12 for supplying a potential V2, and an arithmetic portion 13. The arithmetic portion 13 includes a connection controller 18 and a wiring 17 for outputting the output signal OUT1. The connection controller 18 includes a transistor 14 and a transistor 15. The transistor 15 is a transistor with extremely low off-state current. One of a source and a drain of the transistor 15 is electrically connected to a gate of the transistor 14, and the other of the source and the drain of the transistor 15 is electrically connected to an input terminal of the input signal IN1.

The potential V1 and the potential V2 are given potentials which are different from each other. For example, a power supply potential can be used as the potential V1, and a ground potential can be used as the potential V2.

The transistor 14 controls electrical connection between the wiring 12 and the wiring 17, whereby which of the potential V1 and the potential V2 is output as the output signal OUT1 is controlled.

The transistor 15 holds data of the input signal IN1 in the gate of the transistor 14. Since the transistor 15 is a transistor with extremely low off-state current, electric charges can be held in the gate of the transistor 14 when the transistor 15 is turned off.

In the sum or carry circuit 10 of FIG. 1, the data of the input signal IN1 can be held in the gate of the transistor 14 by turning off the transistor 15. Therefore, a register or the like for holding the data of the input signal IN1 is not needed, and an adder having a logic-in-memory architecture in which a storage function and an arithmetic function are combined can be formed. Power consumption accompanied by saving and returning data can be reduced by employing the logic-in-memory architecture.

In the case where a transistor including an oxide semiconductor is used as the transistor with extremely low off-state current of the transistor 15, the transistor 15 can be stacked over another transistor. Accordingly, the area of one adder can be made small.

A capacitor may be provided so that electric charges can be accumulated (also referred to as charged) as much as possible in the wiring 17. For example, the capacitor may be provided as follows: one electrode of the capacitor is electrically connected to the wiring 17 and a ground potential is used as the potential of the other electrode of the capacitor.

Figure 2:
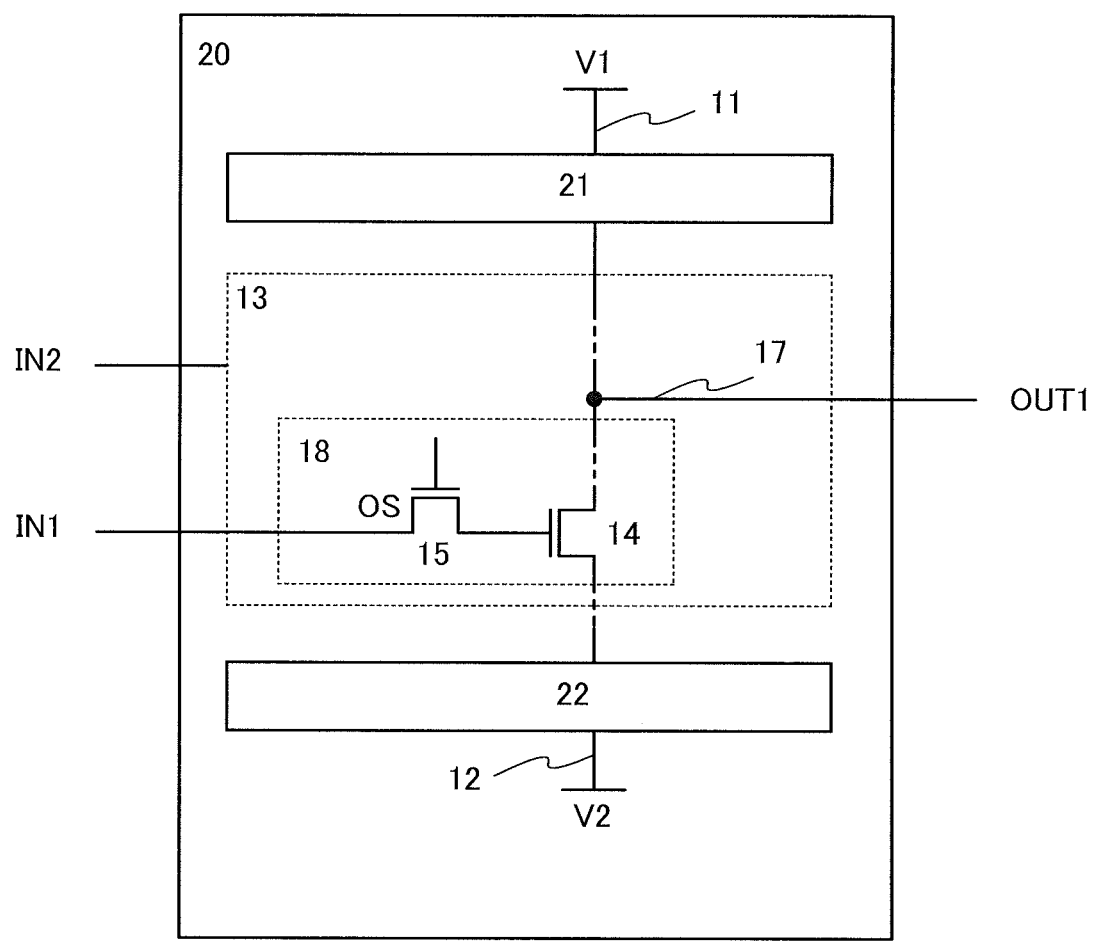
FIG. 2 is a block diagram of an adder.

FIG. 2 is a block diagram illustrating another configuration example of an adder. A sum or carry circuit 20 illustrated in FIG. 2 differs from the sum or carry circuit 10 in FIG. 1 in that the sum or carry circuit 20 includes a potential supply controller 21 and a potential supply controller 22.

The potential supply controller 21 supplies a potential V1 to the arithmetic portion 13 by electrically connecting the wiring 11 and the arithmetic portion 13 in a first period. The potential supply controller 21 does not electrically connect the wiring 11 and the arithmetic portion 13 to each other in a second period after the first period.

The potential supply controller 22 does not electrically connect the wiring 12 and the arithmetic portion 13 to each other in the first period. The potential supply controller 22 supplies a potential V2 to the arithmetic portion 13 by electrically connecting the wiring 12 and the arithmetic portion 13 in the second period after the first period.

In the first period, the potential V1 is supplied from the potential supply controller 21 to the arithmetic portion 13. In the second period, the arithmetic portion 13 outputs the potential of the wiring 17, which is the potential V1 or the potential V2, as the output signal OUT1.

The lengths of the first period and the second period can be set arbitrarily. For example, a period during which a clock signal has a low potential can be set as the first period, and a period during which the clock signal has a high potential can be set as the second period.

In the sum or carry circuit 20 of FIG. 2, the potential supply controllers 21 and 22 control the supply of potentials to the arithmetic portion 13. Accordingly, when the arithmetic portion 13 is electrically connected to the wiring 11, the arithmetic portion 13 is not electrically connected to the wiring 12; and when the arithmetic portion 13 is electrically connected to the wiring 12, the arithmetic portion 13 is not electrically connected to the wiring 11. Therefore, in the sum or carry circuit 20, power consumption accompanied by the operation of the adder can be reduced considerably. Accordingly, the adder consuming less power can be formed.

Figure 3A:
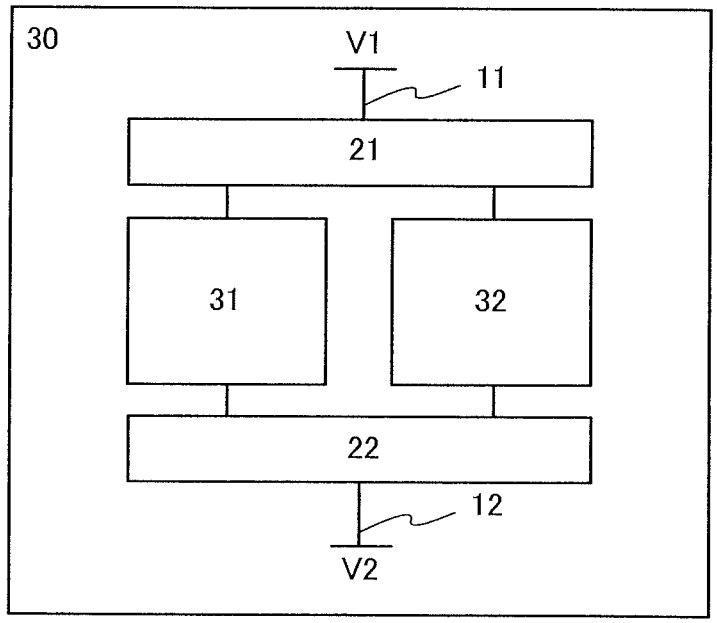
FIGS. 3A to 3C are a block diagram and circuit diagrams of a full adder.

FIG. 3A is a block diagram illustrating a configuration example of a full adder. A full adder 30 adds three binary input signals X, A, and B and outputs two output signals Sum and Carry as arithmetic results. A carry from a low-order bit can be input to the input signal X. A truth table of the full adder 30 is as shown in Table 1. The signals X, A, B, Carry, and Sum in FIGS. 3B and 3C correspond to the signals X, A, B, Carry, and Sum in Table 1, respectively.

Figure 3B:
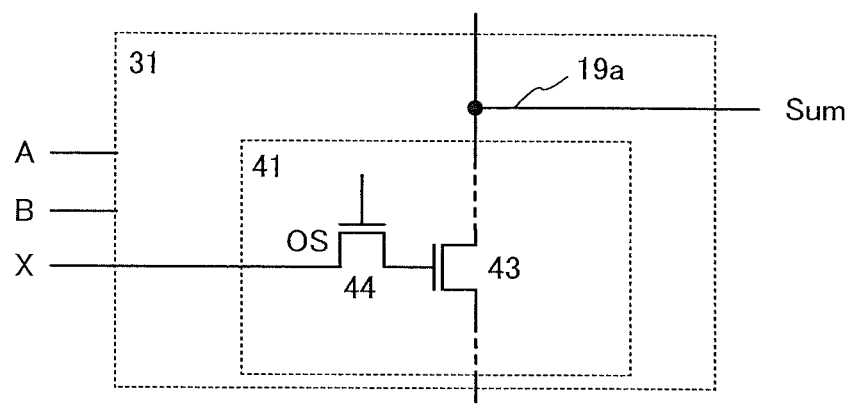
Figure 3C:
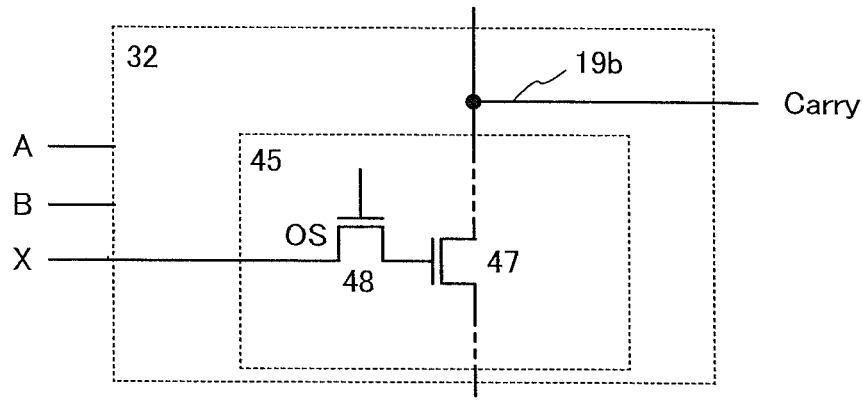

The difference between the full adder 30 illustrated in FIGS. 3A to 3C and the sum or carry circuit in FIG. 2 is that the sum or carry circuit 20 includes one arithmetic portion (the arithmetic portion 13), whereas the full adder 30 includes two arithmetic portions (an arithmetic portion 31 and an arithmetic portion 32).

The potential supply controller 21 in FIG. 3A supplies a potential V1 to the arithmetic portions 31 and 32 by electrically connecting the wiring 11 and the arithmetic portions 31 and 32 in a first period. The potential supply controller 21 does not electrically connect the wiring 11 and the arithmetic portions 31 and 32 to one another in a second period after the first period.

The potential supply controller 22 does not electrically connect the wiring 12 and the arithmetic portions 31 and 32 to one another in the first period. The potential supply controller 22 supplies a potential V2 to the arithmetic portions 31 and 32 by electrically connecting the wiring 12 and the arithmetic portions 31 and 32 to one another in the second period after the first period.

FIG. 3B and FIG. 3C illustrate an example of the arithmetic portion 31 and an example of the arithmetic portion 32, respectively. The arithmetic portion 31 in FIG. 3B includes a wiring 19a for outputting the output signal Sum and a connection controller 41.

The connection controller 41 includes a transistor 43 and a transistor 44. The transistor 44 is a transistor with extremely low off-state current. One of a source and a drain of the transistor 44 is electrically connected to a gate of the transistor 43, and the other of the source and the drain of the transistor 44 is electrically connected to an input terminal of the input signal X.

The transistor 43 controls electrical connection between the wiring 12 and the wiring 19a, whereby which of the potential V1 and the potential V2 is output as the output signal Sum is controlled. The transistor 44 holds data of the input signal X in the gate of the transistor 43.

The connection controller 41 electrically connects the wiring 19a and the wiring 12 to each other only when any one of the input signals X, A, and B has a low potential or all the three input signals have low potentials. The arithmetic portion 31 outputs the potential of the wiring 19a as the output signal Sum in the second period.

The arithmetic portion 32 in FIG. 3C includes a wiring 19b for outputting the output signal Carry and a connection controller 45.

The connection controller 45 includes a transistor 47 and a transistor 48. The transistor 48 is a transistor with extremely low off-state current. One of a source and a drain of the transistor 48 is electrically connected to a gate of the transistor 47, and the other of the source and the drain of the transistor 48 is electrically connected to an input terminal of the input signal X.

The transistor 47 controls electrical connection between the wiring 12 and the wiring 19b, whereby which of the potential V1 and the potential V2 is output as the output signal Carry is controlled. The transistor 48 holds the data of the input signal X in the gate of the transistor 47.

The connection controller 45 electrically connects the wiring 19b and the wiring 12 to each other only when two or more of the input signals X, A, and B have low potentials. The arithmetic portion 32 outputs the potential of the wiring 19b as the output signal Carry in the second period.

The full adder 30 in FIGS. 3A to 3C is a full adder which outputs added results of the inputs signals X, A, and B as the output signals Sum and Carry. Since the transistor 44 and the transistor 48 are each a transistor with extremely low off-state current, the data of the input signal X is held in the gates of the transistor 43 and the transistor 47. Therefore, a register or the like for holding the data of the input signal X is not needed, and a full adder having a logic-in-memory architecture in which a storage function and an arithmetic function are combined can be formed. Power consumption accompanied by saving and returning data can be reduced by employing the logic-in-memory architecture.

The transistor 44 and the transistor 48 which are each a transistor with extremely low off-state current can be stacked over another transistor. Accordingly, the area of one adder can be made small.

The potential supply controllers 21 and 22 control the supply of potentials to the arithmetic portions 31 and 32. Accordingly, when the arithmetic portions 31 and 32 are electrically connected to the wiring 11, the arithmetic portions 31 and 32 are not electrically connected to the wiring 12; and when the arithmetic portions 31 and 32 are electrically connected to the wiring 12, the arithmetic portions 31 and 32 are not electrically connected to the wiring 11. Therefore, power consumption accompanied by the operation of the full adder 30 can be reduced considerably. Accordingly, the full adder 30 consuming less power can be formed.

A capacitor may be provided so that electric charges can be accumulated as much as possible in the wiring 19a. For example, the capacitor may be provided as follows: one electrode of the capacitor is electrically connected to the wiring 19a and a ground potential is used as the potential of the other electrode of the capacitor. The wiring 19b may be provided with another capacitor in a similar manner. For example, the capacitor may be provided as follows: one electrode of the capacitor is electrically connected to the wiring 19b and a ground potential is used as the potential of the other electrode of the capacitor.

Figure 4A:
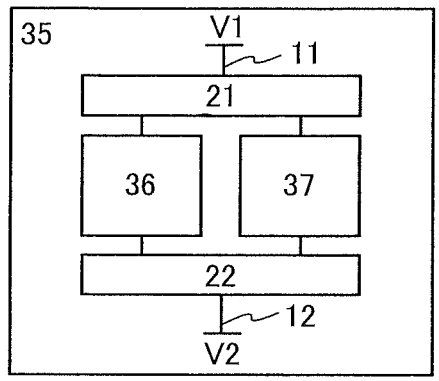
FIGS. 4A to 4C are a block diagram and circuit diagrams of a full adder.

FIG. 4A is a block diagram illustrating another configuration example of a full adder. A full adder 35 illustrated in FIGS. 4A to 4C differs from the full adder 30 in FIGS. 3A to 3C in that an arithmetic portion 36 included in the full adder 35 includes a connection controller 51 and a connection controller 52 in addition to the connection controller 41, and an arithmetic portion 37 included in the full adder 35 includes a connection controller 53, and a connection controller 54 in addition to the connection controller 45.

Figure 4B:
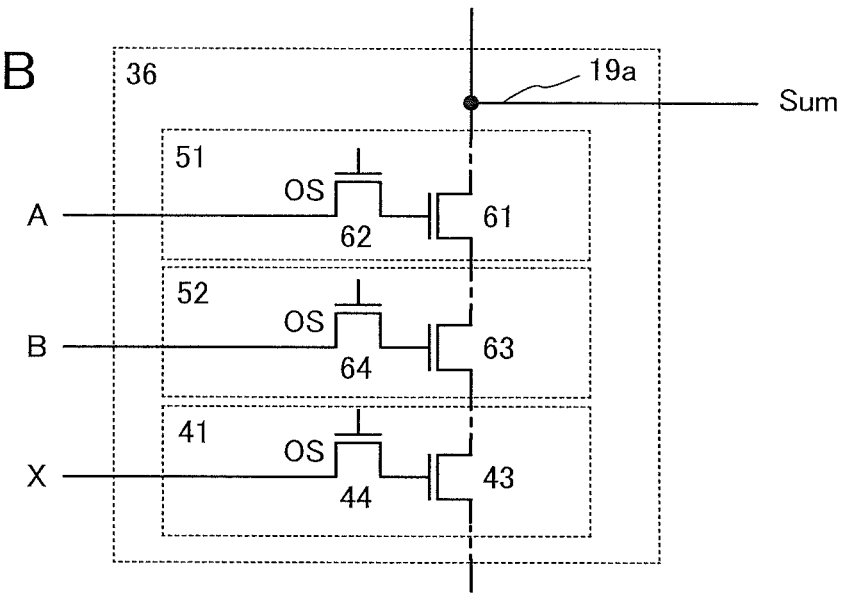
Figure 4C:
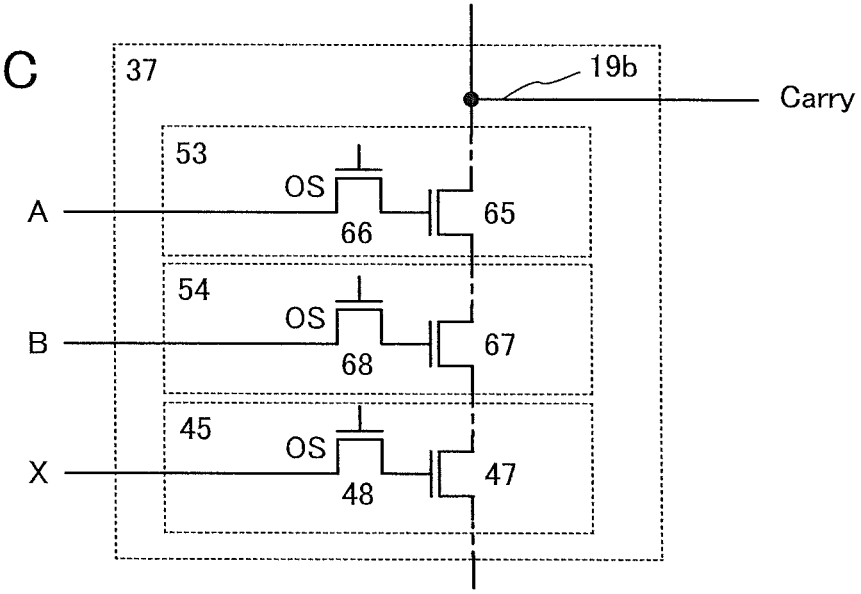

FIG. 4B and FIG. 4C illustrate an example of the arithmetic portion 36 and an example of the arithmetic portion 37, respectively. The arithmetic portion 36 in FIG. 4B includes the connection controller 41, the connection controller 51, the connection controller 52, and the wiring 19a for outputting the output signal Sum. The arithmetic portion 37 in FIG. 4C includes the connection controller 45, the connection controller 53, the connection controller 54, and the wiring 19b for outputting the output signal Carry. In the arithmetic portion 36 and the arithmetic portion 37 in FIGS. 4A to 4C, each of input terminals of the input signals A and B are electrically connected to one of a source and a drain of a transistor with extremely low off-state current in a manner similar to that of the input terminal of the input signal X.

The connection controller 41 in FIG. 4B includes the transistor 43 and the transistor 44. The connection controller 51 includes a transistor 61 and a transistor 62. The connection controller 52 includes a transistor 63 and a transistor 64. The transistor 44, the transistor 62, and the transistor 64 are each a transistor with extremely low off-state current. One of the source and the drain of the transistor 44 is electrically connected to the gate of the transistor 43, and the other of the source and the drain of the transistor 44 is electrically connected to an input terminal of the input signal X. One of a source and a drain of the transistor 62 is electrically connected to a gate of the transistor 61, and the other of the source and the drain of the transistor 62 is electrically connected to an input terminal of the input signal A. One of a source and a drain of the transistor 64 is electrically connected to a gate of the transistor 63, and the other of the source and the drain of the transistor 64 is electrically connected to an input terminal of the input signal B.

The transistor 43, the transistor 61, and the transistor 63 control electrical connection between the wiring 12 and the wiring 19a, whereby which of the potential V1 and the potential V2 is output as the output signal Sum in a second period is controlled. The transistor 44 holds the data of the input signal X in the gate of the transistor 43. The transistor 62 holds data of the input signal A in the gate of the transistor 61. The transistor 64 holds data of the input signal B in the gate of the transistor 63.

The arithmetic portion 36 electrically connects the wiring 19a and the wiring 12 to each other only when any one of the input signals X, A, and B has a low potential or all the three input signals have low potentials. The arithmetic portion 36 outputs the potential of the wiring 19a as the output signal Sum in the second period.

The connection controller 45 in FIG. 4C includes the transistor 47 and the transistor 48. The connection controller 53 includes a transistor 65 and a transistor 66. The connection controller 54 includes a transistor 67 and a transistor 68. The transistor 48, the transistor 66, and the transistor 68 are each a transistor with extremely low off-state current. One of the source and the drain of the transistor 48 is electrically connected to the gate of the transistor 47, and the other of the source and the drain of the transistor 48 is electrically connected to an input terminal of the input signal X. One of a source and a drain of the transistor 66 is electrically connected to a gate of the transistor 65, and the other of the source and the drain of the transistor 66 is electrically connected to an input terminal of the input signal A. One of a source and a drain of the transistor 68 is electrically connected to a gate of the transistor 67, and the other of the source and the drain of the transistor 68 is electrically connected to an input terminal of the input signal B.

The transistor 47, the transistor 65, and the transistor 67 control electrical connection between the wiring 12 and the wiring 19b, whereby which of the potential V1 or the potential V2 is output as the output signal Carry in the second period is controlled. The transistor 48 holds the data of the input signal X in the gate of the transistor 47. The transistor 66 holds the data of the input signal A in the gate of the transistor 65. The transistor 68 holds the data of the input signal B in the gate of the transistor 67.

The arithmetic portion 37 electrically connects the wiring 19b and the wiring 12 to each other only when two or more of the input signals X, A, and B have low potentials. The arithmetic portion 37 outputs the potential of the wiring 19b as the output signal Carry in the second period.

The full adder 35 including the arithmetic portion 36 and the arithmetic portion 37 in FIG. 4A can hold the data of the input signals X, A, and B. Even when the power is turned off in the middle of arithmetic of plural bits, the arithmetic can be continued when the power is turned on again because all the three data which are input to the full adder can be held.

<Specific Configuration Examples of Adder>

Figure 5:
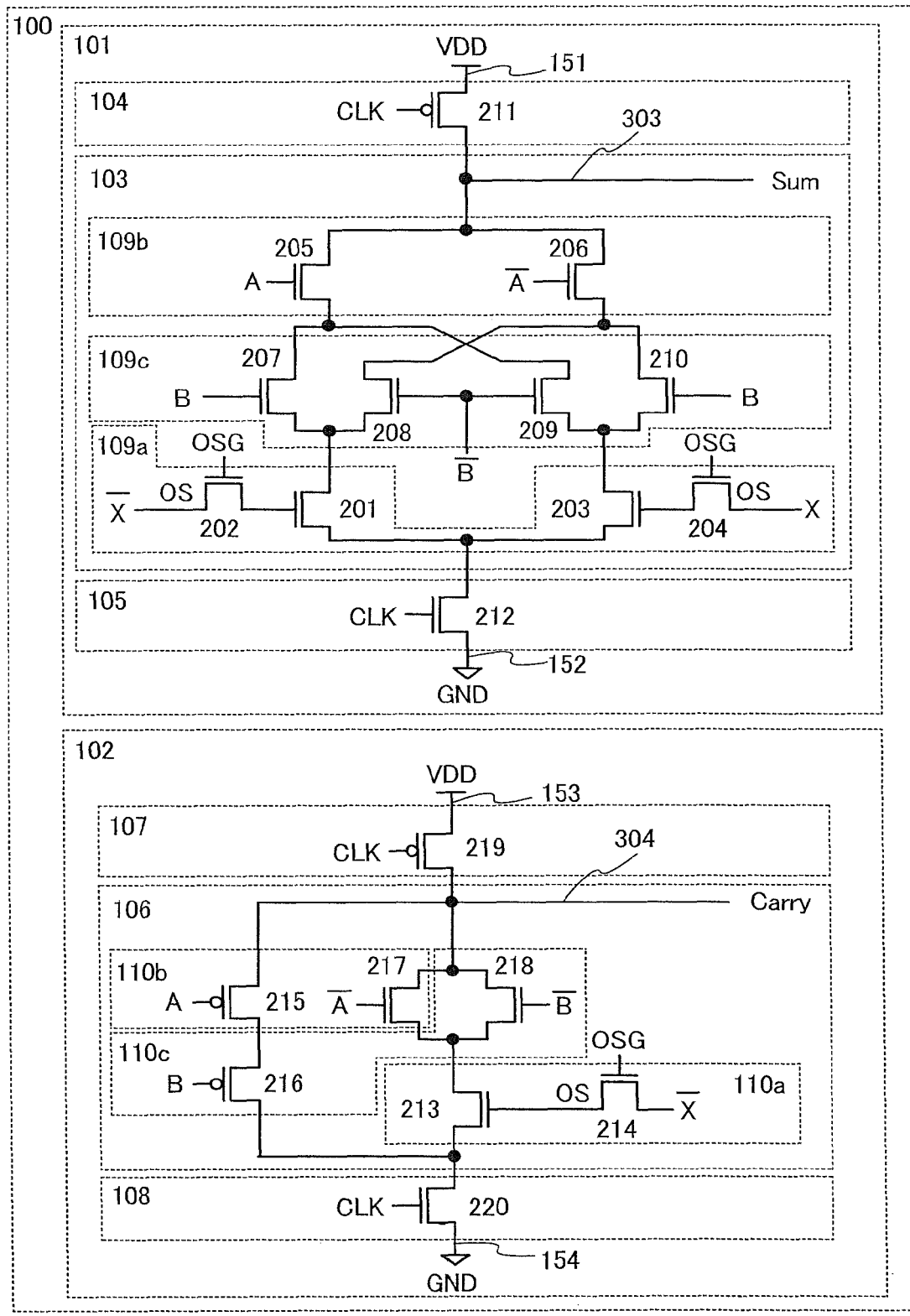
FIG. 5 is a circuit diagram of a full adder.

FIG. 5 illustrates a specific configuration example of a full adder. A full adder 100 in FIG. 5 adds three binary input signals X, A, and B and outputs two output signals Sum and Carry as arithmetic results. A truth table of the full adder 100 is as shown in Table 1. The signals X, A, B, Carry, and Sum in FIG. 5 correspond to the signals X, A, B, Carry, and Sum in Table 1, respectively.

The full adder 100 in FIG. 5 includes a sum circuit 101 and a carry circuit 102. The sum circuit 101 includes an arithmetic portion 103, a potential supply controller 104, a potential supply controller 105, a wiring 151 for supplying a potential VDD (also referred to as a power supply potential), and a wiring 152 for supplying a potential GND (also referred to as a ground potential). The carry circuit 102 includes an arithmetic portion 106, a potential supply controller 107, a potential supply controller 108, a wiring 153 for supplying a potential VDD (also referred to as a power supply potential), and a wiring 154 for supplying a potential GND (also referred to as a ground potential).

First, the sum circuit 101 will be described. The arithmetic portion 103 of the sum circuit 101 includes a wiring 303 for outputting the output signal Sum, a connection controller 109a, a connection controller 109b, and a connection controller 109c. The connection controller 109a includes a transistor 201, a transistor 202, a transistor 203, and a transistor 204. The connection controller 109b includes a transistor 205 and a transistor 206. The connection controller 109c includes a transistor 207, a transistor 208, a transistor 209, and a transistor 210.

The potential supply controller 104 includes a transistor 211. The potential supply controller 105 includes a transistor 212.

The wiring 303 is electrically connected to one of a source and a drain of the transistor 211, one of a source and a drain of the transistor 205, and one of a source and a drain of the transistor 206.

A gate of the transistor 201 is electrically connected to one of a source and a drain of the transistor 202. One of a source and a drain of the transistor 201 is electrically connected to one of a source and a drain of the transistor 207 and one of a source and a drain of the transistor 208. The other of the source and the drain of the transistor 201 is electrically connected to one of a source and a drain of the transistor 203 and one of a source and a drain of the transistor 212.

The transistor 202 is a transistor with extremely low off-state current. A gate of the transistor 202 is electrically connected to an OSG input terminal, and the other of the source and the drain of the transistor 202 is electrically connected to an input terminal of an inverted signal of the input signal X. Here, an OSG signal refers to a signal which is input to a gate of a transistor with extremely low off-state current.

A gate of the transistor 203 is electrically connected to one of a source and a drain of the transistor 204, and the other of the source and the drain of the transistor 203 is electrically connected to one of a source and a drain of the transistor 209 and one of a source and a drain of the transistor 210.

The transistor 204 is a transistor with extremely low off-state current. A gate of the transistor 204 is electrically connected to an OSG input terminal, and the other of the source and the drain of the transistor 204 is electrically connected to an input terminal of the input signal X.

A gate of the transistor 205 is electrically connected to an input terminal of the input signal A, and the other of the source and the drain of the transistor 205 is electrically connected to the other of the source and the drain of the transistor 207 and the other of the source and the drain of the transistor 209.

A gate of the transistor 206 is electrically connected to an input terminal of an inverted signal of the input signal A, and the other of the source and the drain of the transistor 206 is electrically connected to the other of the source and the drain of the transistor 208 and the other of the source and the drain of the transistor 210.

A gate of the transistor 207 is electrically connected to an input terminal of the input signal B.

Gates of the transistor 208 and the transistor 209 are electrically connected to an input terminal of an inverted signal of the input signal B.

A gate of the transistor 210 is electrically connected to an input terminal of the input signal B.

The transistor 211 of the potential supply controller 104 is a p-channel transistor. A gate of the transistor 211 is electrically connected to an input terminal of a clock signal, and the other of the source and the drain of the transistor 211 is electrically connected to the wiring 151.

A gate of the transistor 212 of the potential supply controller 105 is electrically connected to an input terminal of a clock signal, and the other of the source and the drain of the transistor 212 is electrically connected to the wiring 152.

The sum circuit 101 electrically connects the wiring 152 and the wiring 303 to each other only when any one of the input signals X, A, and B or all the three input signals have low potentials. The sum circuit 101 outputs the potential of the wiring 303 as the output signal Sum in the second period.

Next, the carry circuit 102 will be described. The arithmetic portion 106 of the carry circuit 102 includes a wiring 304 for outputting the output signal Carry, a connection controller 110a, a connection controller 110b, and a connection controller 110c. The connection controller 110a includes a transistor 213 and a transistor 214. The connection controller 110b includes a transistor 215 and a transistor 217. The connection controller 110c includes a transistor 216 and a transistor 218.

The potential supply controller 107 includes a transistor 219. The potential supply controller 108 includes a transistor 220.

A gate of the transistor 213 is electrically connected to one of a source and a drain of the transistor 214, one of a source and a drain of the transistor 213 is electrically connected to one of a source and a drain of the transistor 217 and one of a source and a drain of the transistor 218, and the other of the source and the drain of the transistor 213 is electrically connected to one of a source and a drain of the transistor 216 and one of a source and a drain of the transistor 220.

The transistor 214 is a transistor with extremely low off-state current. A gate of the transistor 214 is electrically connected to an OSG input terminal, and the other of the source and the drain of the transistor 214 is electrically connected to an input terminal of an inverted signal of the input signal X.

The transistor 215 is a p-channel transistor. A gate of the transistor 215 is electrically connected to an input terminal of the input signal A; one of a source and a drain of the transistor 215 is electrically connected to the wiring 304, the other of the source and the drain of the transistor 217, the other of the source and the drain of the transistor 218, and one of a source and a drain of the transistor 219; and the other of the source and the drain of the transistor 215 is electrically connected to the other of the source and the drain of the transistor 216.

The transistor 216 is a p-channel transistor, and a gate of the transistor 216 is electrically connected to an input terminal of the input signal B.

A gate of the transistor 217 is electrically connected to an input terminal of an inverted signal of the input signal A.

A gate of the transistor 218 is electrically connected to an input terminal of an inverted signal of the input signal B.

The transistor 219 of the potential supply controller 107 is a p-channel transistor. A gate of the transistor 219 is electrically connected to an input terminal of a clock signal, and the other of the source and the drain of the transistor 219 is electrically connected to the wiring 153.

A gate of the transistor 220 of the potential supply controller 108 is electrically connected to an input terminal of a clock signal, and the other of the source and the drain of the transistor 220 is electrically connected to the wiring 154.

The carry circuit 102 electrically connects the wiring 154 and the wiring 304 only when any two of the input signals X, A, and B or all the three input signals have low potentials. The carry circuit 102 outputs the potential of the wiring 303 as the output signal Carry in the second period.

As described above, the full adder 100 in FIG. 5 includes the 17 transistors and the 3 transistors with extremely low off-state current. In such a manner, with the use of the transistors with extremely low off-state current, a full adder having a logic-in-memory architecture can be formed with a small number of transistors.

Note that a capacitor may be provided so that electric charges can be accumulated as much as possible in the wiring 303. For example, the capacitor may be provided as follows: one electrode of the capacitor is electrically connected to the wiring 303 and a ground potential is used as the potential of the other electrode of the capacitor. The wiring 304 may be provided with another capacitor in a similar manner. For example, the capacitor may be provided as follows: one electrode of the capacitor is electrically connected to the wiring 304 and a ground potential is used as the potential of the other electrode of the capacitor.

Figure 6:
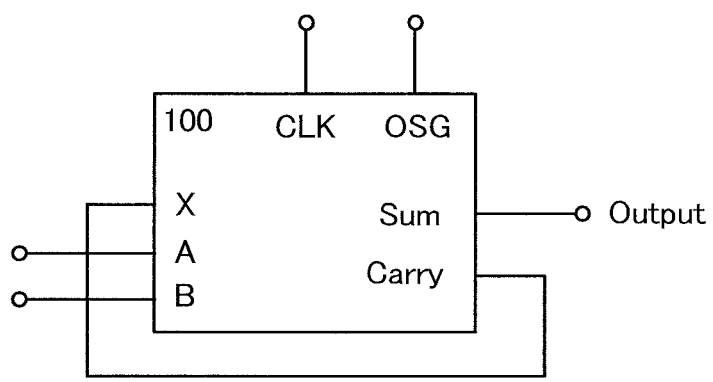
FIG. 6 is a block diagram of a full adder.

FIG. 6 illustrates a block diagram in the case where the full adder 100 is a serial full adder. Two signals of plural bits are input to an input terminal of the input signal A and an input terminal of the input signal B of the full adder 100 in series (sequentially from the lowest-order bit). In addition, a carry output terminal is electrically connected to an X input terminal. With such an architecture, the two signals of plural bits can be added sequentially from the lowest-order bit.

For example, addition of two signals of plural bits, one of which is denoted by $(Y_3Y_2Y_1)$ and the other of which is denoted by $(Z_3Z_2Z_1)$, will be described. First, the lowest-order bit signal $Y_1$ and the lowest-order bit signal $Z_1$ are input as an input signal $A_1$ and an input signal $B_1$, respectively. There is no carrier signal of the previous bit in the lowest-order bit arithmetic; therefore, 0 is input as an input signal $X_1$. Arithmetic of the input signals $A_1$, $B_1$, and $X_1$ is performed to obtain output signals $Sum_1$ and $Carry_1$. The output signal $Sum_1$ is output. Subsequently, the second lowest-order bit signal $Y_2$ and the second lowest-order bit signal $Z_2$ are input as an input signal $A_2$ and an input signal $B_2$, respectively. The output signal $Carry_1$ which is the carry signal of the previous bit is input as an input signal $X_2$. Arithmetic of the input signals $A_2$, $B_2$, and $X_2$ is performed to obtain output signals $Sum_2$ and $Carry_2$. The output signal $Sum_2$ is output. In a similar manner, the third lowest-order bit signal $Y_3$ and the third lowest-order bit signal $Z_3$ are input as an input signal $A_3$ and an input signal $B_3$, respectively, and the output signal $Carry_2$ which is the carry signal of the previous bit is input as an input signal $X_3$. Arithmetic of the input signals $A_3$, $B_3$, and $X_3$ is performed to obtain output signals $Sum_3$ and $Carry_3$. The output signal $Sum_3$ is output. As described above, the result of adding the signals $(Y_3Y_2Y_1)$ and $(Z_3Z_2Z_1)$ is obtained.

The full adder 100 holds the data of the input signal X in one of a source and a drain of a transistor with extremely low off-state current. Therefore, a register or the like for holding the data of the input signal X is not needed, and a full adder having a logic-in-memory architecture in which a storage function and an arithmetic function are combined can be formed. Power consumption accompanied by saving and returning data can be reduced by employing the logic-in-memory architecture.

Figure 7:
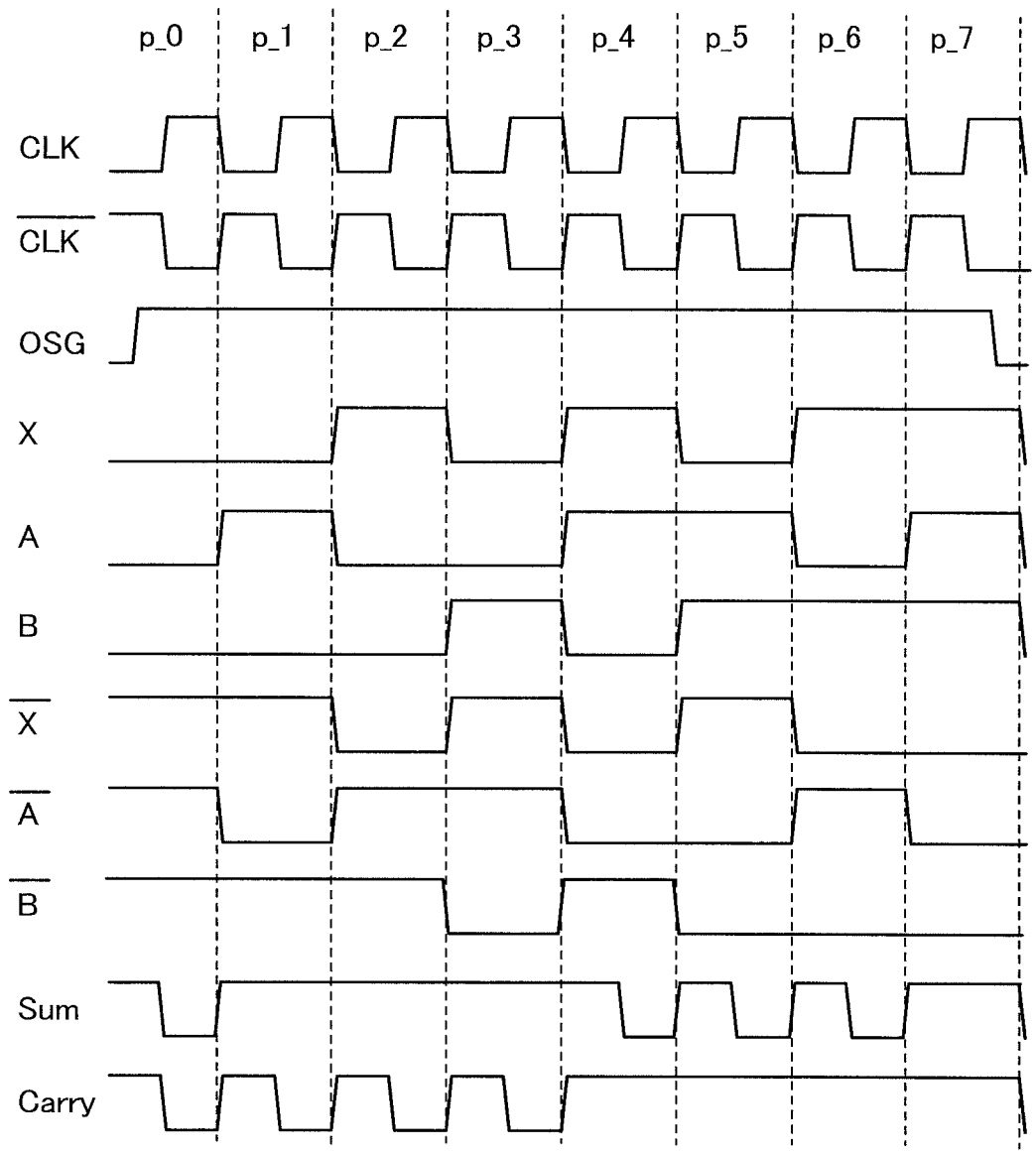
FIG. 7 is a timing chart illustrating operation of a full adder.

FIG. 7 is a timing chart illustrating an example of a driving method of the full adder 100. In the timing chart of FIG. 7, periods p_0 (also referred to as a period 0), p_1 (also referred to as a period 1), p_2 (also referred to as a period 2), p_3 (also referred to as a period 3), p_4 (also referred to as a period 4), p_5 (also referred to as a period 5), p_6 (also referred to as a period 6), and p_7 (also referred to as a period 7) corresponds to p_0, p_1, p_2, p_3, p_4, p_5, p_6, and p_7 in the truth table of Table 1, which are periods for inputting and outputting the data, respectively.

First, operation of p_0 will be described. At the time of p_0, a low potential (data 0) is input to the input signals X, A, and B.

When a clock signal CLK has a low potential in p_0, the transistor 211 and the transistor 219 in the potential supply controller 104 and the potential supply controller 107, respectively, are turned on, and electric charges are accumulated in the wiring 303 and the wiring 304.

Subsequently, the transistor 202, the transistor 204, and the transistor 214 are turned on by changing the potential of an OSG signal from a low potential to a high potential. The potential of the OSG signal is preferably changed from a low potential to a high potential when the clock signal CLK has a low potential. Note that the potential of the clock signal CLK may be the same as that of the OSG signal.

Subsequently, the transistor 211 and the transistor 219 are turned off by changing the potential of the clock signal CLK from a low potential to a high potential. At this time, arithmetic of the output signal Sum is performed from the input signals X, A, and B in the sum circuit 101, and arithmetic of the output signal Carry is performed from the input signals X, A and B in the carry circuit 102. The results of the arithmetic are output. In p_0, the electric charges accumulated in the wiring 303 and the wiring 304 are lost because the wiring 303 and the wiring 304 are grounded; therefore, the output signals Sum and Carry have low potentials (data 0).

In a similar manner, in p_1 to p_7, electric charges are accumulated when the clock signal CLK has a low potential, and arithmetic of the output signals Sum and Carry is performed and the results thereof are output when the clock signal CLK has a high potential. When the accumulated electric charges are lost because of the ground, a low potential (data 0) is output, and when there is no ground, a high potential (data 1) is output by the accumulated electric charges.

Through the driving as described above, the full adder 100 can perform the arithmetic shown in the truth table of Table 1.

<Variation of Specific Configuration Examples of Adder>

Figure 8:
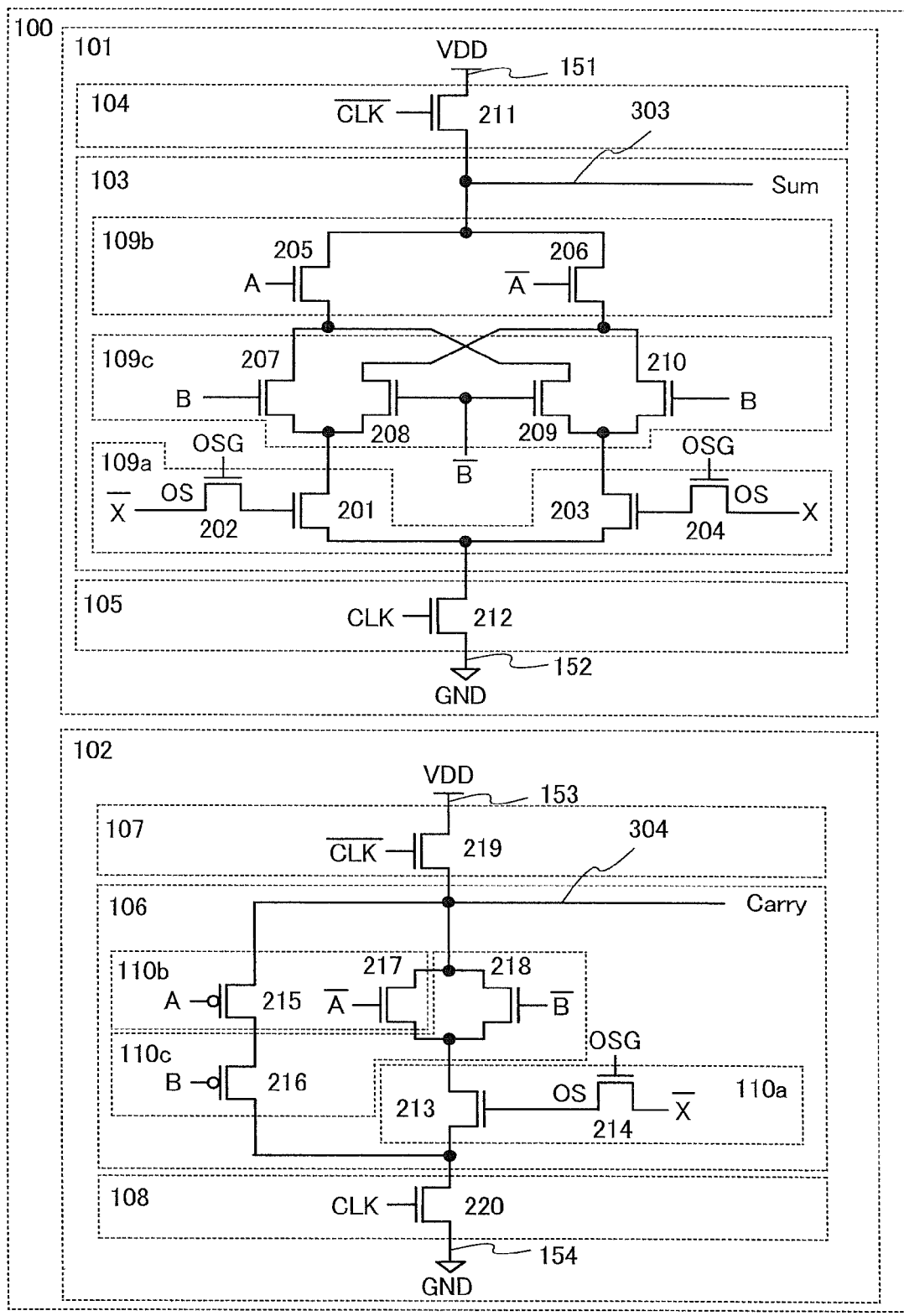
FIG. 8 is a circuit diagram of a full adder.

FIG. 8 illustrates another specific configuration example of the full adder. The full adder in FIG. 8 differs from the full adder in FIG. 5 in that the transistor 211 and the transistor 219 are each an n-channel transistor and an input terminal of an inverted signal of a clock signal is electrically connected to each gate of the transistor 211 and the transistor 219.

Note that as the transistor 211, the transistor 212, the transistor 219, and the transistor 220, transistors with extremely low off-state current may be used. With the use of the transistors with extremely low off-state current, the power consumption accompanied by the operation of an adder can be reduced further.

Transistors including an oxide semiconductor are used as the transistors each electrically connected to the input terminal of the clock signal or the inverted signal of the clock signal, whereby leakage current accompanied by the operation of an adder can be reduced. In addition, since the transistor using an oxide semiconductor can be stacked over another transistor, the area of one adder can be made small.

Figure 9:
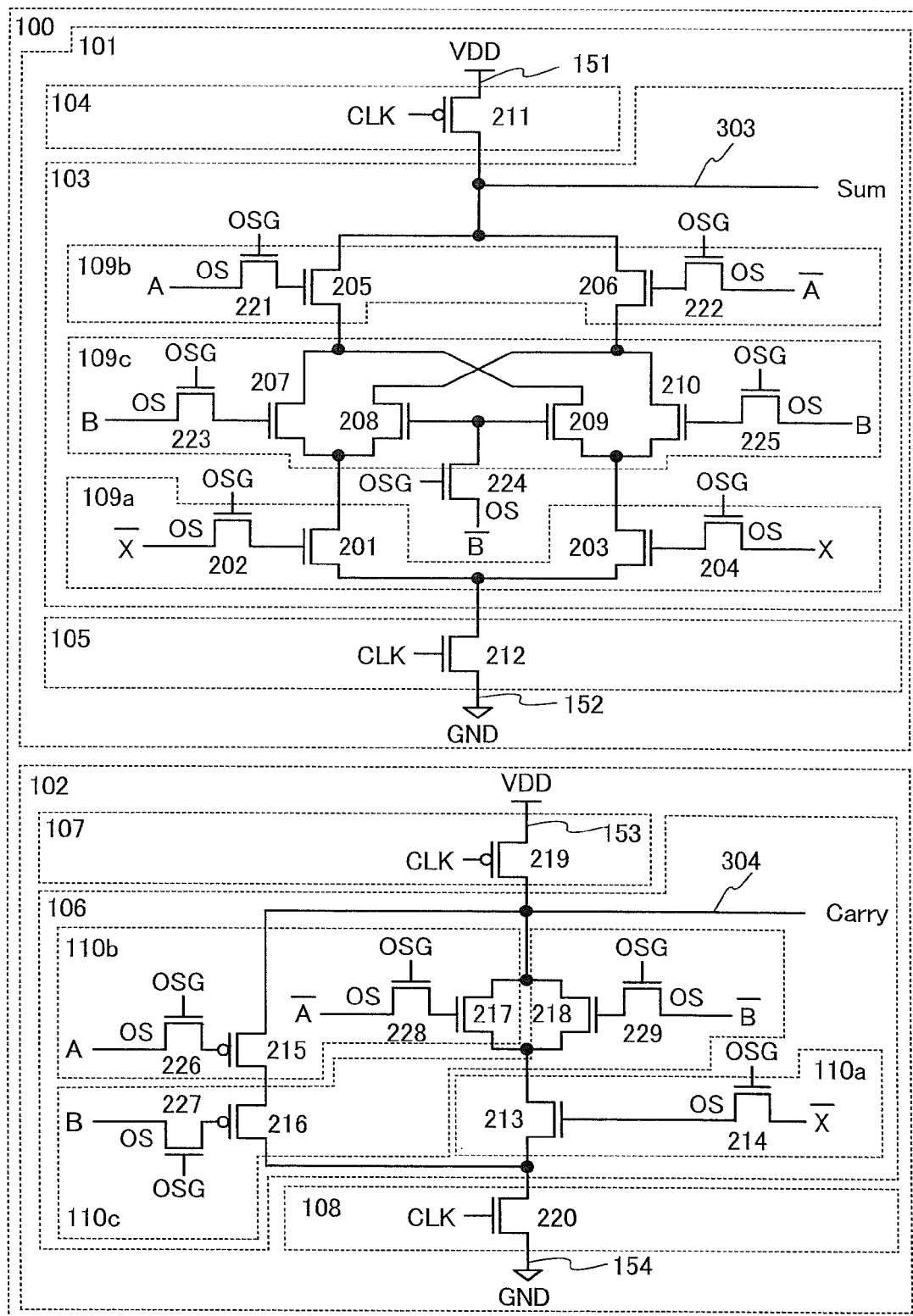
FIG. 9 is a circuit diagram of a full adder.

FIG. 9 illustrates another specific configuration example of the full adder. The full adder in FIG. 9 differs from the full adder in FIG. 8 in that not only the data of the input signal X but also the data of the input signals A and B are held in one of a source and a drain of a transistor with extremely low off-state current.

In order to hold the data of the input signals A and B, the sum circuit 101 includes a transistor 221, a transistor 222, a transistor 223, a transistor 224, and a transistor 225, and the carry circuit 102 includes a transistor 226, a transistor 227, a transistor 228, and a transistor 229.

The transistors 221 to 229 are each a transistor with extremely low off-state current and each gate is electrically connected to an OSG input terminal.

One of a source and a drain of the transistor 221 is electrically connected to the gate of the transistor 205, and the other of the source and the drain of the transistor 221 is electrically connected to an input terminal of the input signal A.

One of a source and a drain of the transistor 222 is electrically connected to the gate of the transistor 206, and the other of the source and the drain of the transistor 222 is electrically connected to an input terminal of the inverted signal of the input signal A.

One of a source and a drain of the transistor 223 is electrically connected to the gate of the transistor 207, and the other of the source and the drain of the transistor 223 is electrically connected to an input terminal of the input signal B.

One of a source and a drain of the transistor 224 is electrically connected to the gates of the transistor 208 and the transistor 209, and the other of the source and the drain of the transistor 224 is electrically connected to an input terminal of the inverted signal of the input signal B.

One of a source and a drain of the transistor 225 is electrically connected to the gate of the transistor 210, and the other of the source and the drain of the transistor 225 is electrically connected to an input terminal of the input signal B.

One of a source and a drain of the transistor 226 is electrically connected to the gate of the transistor 215, and the other of the source and the drain of the transistor 226 is electrically connected to an input terminal of the input signal A.

One of a source and a drain of the transistor 227 is electrically connected to the gate of the transistor 216, and the other of the source and the drain of the transistor 227 is electrically connected to an input terminal of the input signal B.

One of a source and a drain of the transistor 228 is electrically connected to the gate of the transistor 217, and the other of the source and the drain of the transistor 228 is electrically connected to an input terminal of the inverted signal of the input signal A.

One of a source and a drain of the transistor 229 is electrically connected to the gate of the transistor 218, and the other of the source and the drain of the transistor 229 is electrically connected to an input terminal of the inverted signal of the input signal B.

The full adder 100 in FIG. 9 can hold each of the data of the input signals X, A, and B in one of a source and a drain of the transistors with extremely low off-state current. Even when the power is turned off in the middle of arithmetic of plural bits, the arithmetic can be continued when the power is turned on again because all the three data which are input to the full adder can be held.

In such a manner, a signal processing circuit in which, even when the power is turned off in the middle of arithmetic of plural bits, the arithmetic can be continued when the power is turned on again can be achieved using the transistors with extremely low off-state current, for example, transistors including an oxide semiconductor.

Meanwhile, a magnetic tunnel junction element (MTJ element) is known as a storage element used for a nonvolatile storage element. The MTJ element is an element for storing information in a low-resistance state when the magnetization directions of ferromagnetic films which are formed with an insulating film provided therebetween are parallel and storing information in a high-resistance state when the spin directions are anti-parallel. Therefore, the principle of the MTJ element is completely different from that of the storage element described in this embodiment. Table 2 shows a comparison between the MTJ element and a transistor including an oxide semiconductor as the storage element described in this embodiment.

TABLE 2

| | Spintronics (MTJ element) | Storage element according to this embodiment |
|---|---|---|
| Heat resistance | Curie temperature | Process temperature around 500° C. (Reliability at 150° C.) |
| Driving method | Current driving | Voltage driving |
| Writing principle | Changing magnetization direction of magnetic body film | On/off of FET |
| Si LSI | Suitable for bipolar LSI (MOS device is preferable for high integration because bipolar device is unsuitable for high integration. Note that W gets larger.) | Suitable for MOS LSI |
| Overhead | Large (Because of high Joule heat) | Smaller by 2 to 3 or more orders of magnitude than the MTJ element (Because of charging and discharging of parasitic capacitance) |
| Nonvolatility | Utilizing spin | Utilizing low off-state current |
| Number of times of holding electric charges | Without limitation | Without limitation |

TABLE 2-continued

| | Spintronics (MTJ element) | Storage element according to this embodiment |
|---|---|---|
| 3D conversion | Difficult (at most two layers) | Easy (the number of layers is limitless) |
| Integration degree ($F^2$) | 4 $F^2$ to 15 $F^2$ | Depends on the number of layers stacked in 3D conversion (it is necessary to ensure heat resistance in process of forming upper oxide semiconductor FET) |
| Material Cost per bit | Magnetic rare-earth element High | Oxide semiconductor material Low (Might be slightly high depending on oxide semiconductor material (such as In) |
| Resistance to magnetic field | Low | High |

The MTJ element has a disadvantage in that a magnetic property is lost when the temperature is higher than or equal to the Curie temperature because a magnetic material is used. In addition, the MTJ element is compatible with a silicon bipolar device because current driving is employed; however, the bipolar device is unsuitable for high integration. Further, there is a problem in that power consumption is increased by an increase of memory capacity, though the writing current of the MTJ element is extremely low.

In principal, the MTJ element has low resistance to a magnetic field, and the magnetization direction is easily changed when the MTJ element is exposed to a high magnetic field. In addition, it is necessary to control magnetic fluctuation which is caused by nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. The material cost per bit of the MTJ element is expensive.

On the other hand, the storage element according to this embodiment is similar to a silicon MOSFET in the element structure and the operation principal except a material which forms the channel. The storage element according to this embodiment is not affected by a magnetic field, and the storage element does not cause soft error. This shows that the transistor is highly compatible with a silicon integrated circuit.

Embodiment 2

In this embodiment, an example of a transistor including an oxide semiconductor, which can be used as the transistor with extremely low off-state current described in Embodiment 1, will be described with reference to FIGS. 10A and 10B, FIGS. 11A and 11B, and FIGS. 12A and 12B.

Figure 10A:
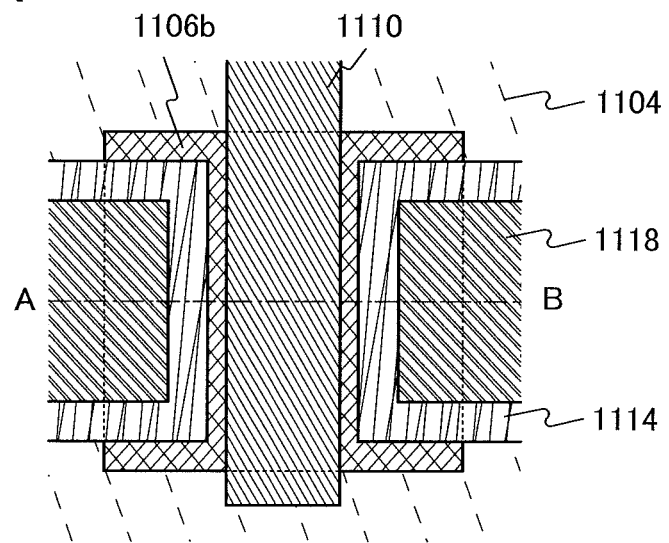
FIGS. 10A and 10B illustrate a structure of a transistor.
Figure 10B:
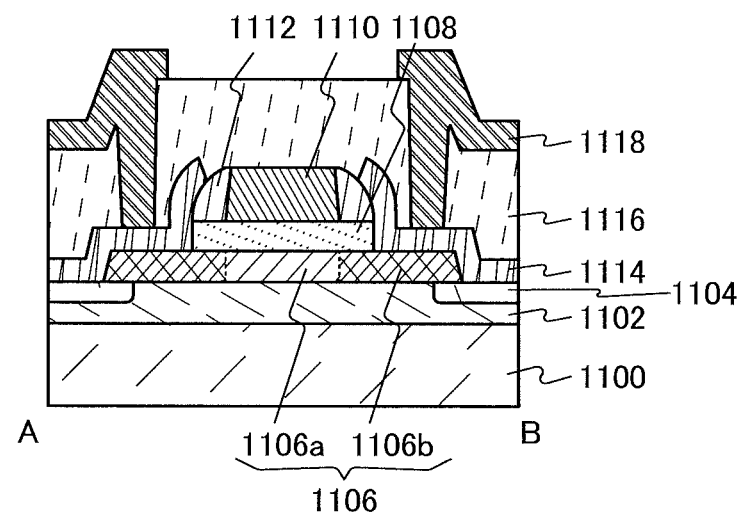

FIGS. 10A and 10B are a top view and a cross-sectional view of a coplanar transistor having a top-gate top-contact structure, which is an example of the transistor including an oxide semiconductor. FIG. 10A is the top view of the transistor, and FIG. 10B illustrates a cross-section A-B taken along the dashed-dotted line A-B in FIG. 10A.

The transistor illustrated in FIG. 10B includes a substrate 1100; a base insulating film 1102 provided over the substrate 1100; a protective insulating film 1104 provided in the periphery of the base insulating film 1102; an oxide semiconductor film 1106 which is provided over the base insulating film 1102 and the protective insulating film 1104 and includes a high-resistance region 1106a and low-resistance regions 1106b; a gate insulating film 1108 provided over the oxide semiconductor film 1106; a gate electrode 1110 provided to overlap with the high-resistance region 1106a with the gate insulating film 1108 provided therebetween; a sidewall insulating film 1112 provided in contact with a side surface of the gate electrode 1110; and a pair of electrodes 1114 provided in contact with at least the low-resistance regions 1106b and the sidewall insulating film 1112. The transistor may include an interlayer insulating film 1116 which is provided to cover the transistor, and wiring 1118s connected to the pair of electrodes 1114 through openings provided in the interlayer insulating film 1116.

Although not illustrated, a protective film may be provided to cover the interlayer insulating film 1116 and the wirings 1118. With the protective film, a minute amount of leakage current generated by surface conduction of the interlayer insulating film 1116 can be reduced, so that the off-state current of the transistor can be reduced.

An oxide semiconductor to be used for the oxide semiconductor film 1106 preferably contains at least indium (In) or zinc (Zn). In particular, In and Zn are preferably contained. A stabilizer for reducing variation in electric characteristics of a transistor including the oxide semiconductor is preferably contained in addition to In and Zn. As the stabilizer, at least any of gallium (Ga), tin (Sn), hafnium (Hf), and aluminum (Al) is used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn—based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as main components and there is no particular limitation on the ratio of In, Ga, and Zn. The In—Ga—Zn-based oxide may contain a metal element other than the In, Ga, and Zn.

As the oxide semiconductor, a material represented by $InMO_3(ZnO)_m$ (m>0 is satisfied) may be used. Note that M represents one or more metal elements selected from Ga, Fe, Mn, and Co. Alternatively, as the oxide semiconductor, a material represented by $In_3SnO_5(ZnO)_n$ (n>0) may be used.

For example, an In—Ga—Zn-based oxide with an atomic ratio of In:Ga:Zn=1:1:1 or In:Ga:Zn=2:2:1, or any of oxides whose composition is in the neighborhood of the above compositions can be used. Alternatively, an In—Sn—Zn-based oxide with an atomic ratio of In:Sn:Zn=1:1:1, In:Sn:Zn=2:1:3 (=1/3:1/6:1/2), or In:Sn:Zn=2:1:5, or any of oxides whose composition is in the neighborhood of the above compositions can be used.

However, the composition is not limited to those described above, and a material having an appropriate composition may be used depending on required semiconductor characteristics (e.g., field-effect mobility, threshold voltage, and variation). In order to obtain required semiconductor characteristics, it is preferable that the carrier concentration, the impurity concentration, the defect density, the atomic ratio of a metal element to oxygen, the interatomic distance, the density, and the like be set to appropriate values.

For example, high field-effect mobility can be obtained relatively easily in the case of using an In—Sn—Zn oxide. However, field-effect mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor film having a crystal part as the CAAC-OS film, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that the average surface roughness Ra is obtained by three-dimension expansion of center line average roughness that is defined by JIS B 0601 so as to be applied to a plane. The average surface roughness Ra can be expressed as an "average value of the absolute values of deviations from a reference surface to a specific surface" and is defined by the formula (1) below.

[FORMULA 1]

$$Ra = \frac{1}{S_0} \int_{y_1}^{y_2} \int_{x_1}^{x_2} |f(x, y) - Z_0| dx dy \qquad (1)$$

In the above formula, $S_0$ represents an area of a plane to be measured (a quadrangular region which is defined by four points represented by coordinates $(x_1, y_1)$, $(x_1, y_2)$, $(x_2, y_1)$, and $(x_2, y_2)$), and $Z_0$ represents an average height of the plane to be measured. The average surface roughness Ra can be measured using an atomic force microscope (AFM).

The thickness of the oxide semiconductor film is preferably greater than or equal to 3 nm and less than or equal to 30 nm. This is because the transistor might possibly be normally on when the oxide semiconductor film is too thick (e.g., when the thickness is greater than or equal to 50 nm).

As an example of such a CAAC-OS film, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC-OS film will be described in detail with reference to FIGS. 18A to 18E, FIGS. 19A to 19C, FIGS. 20A to 20C, and 21A and 21B. FIGS. 18A to 18E, FIGS. 19A to 19C, FIGS. 20A to 20C, and 21A and 21B, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents tetracoordinate O and O surrounded by a double circle represents tricoordinate O.

Figure 18A:
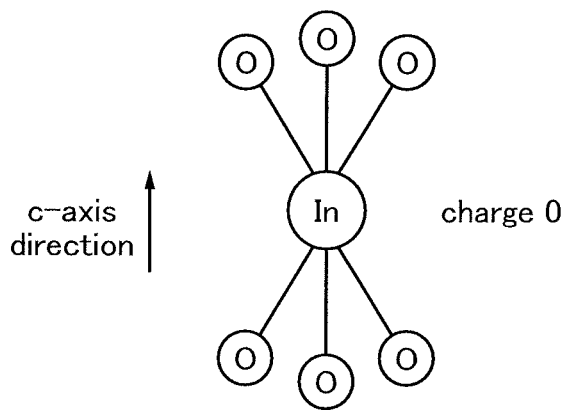
FIGS. 18A to 18E each illustrate a crystal structure of an oxide semiconductor.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0 (zero).

Figure 18D:
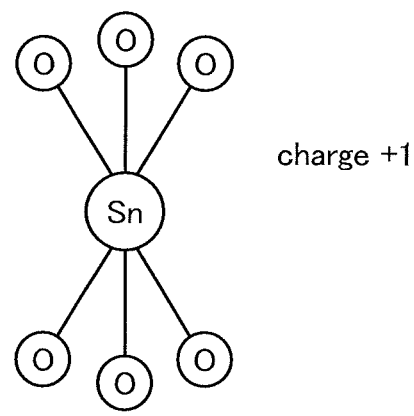
Figure 18B:
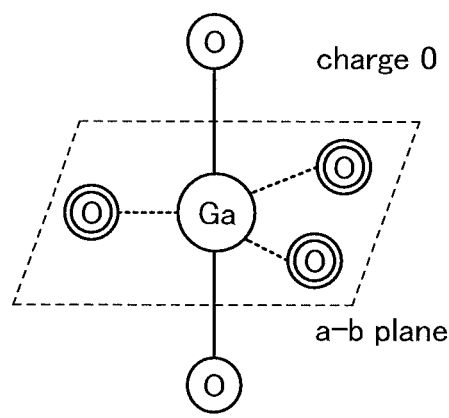

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom (or near neighbor Ga atom). All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
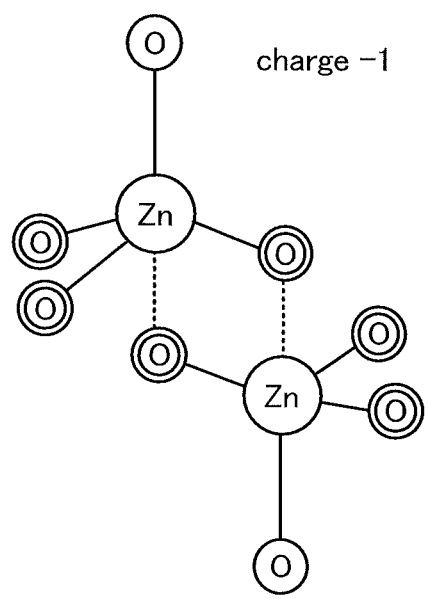
Figure 18C:
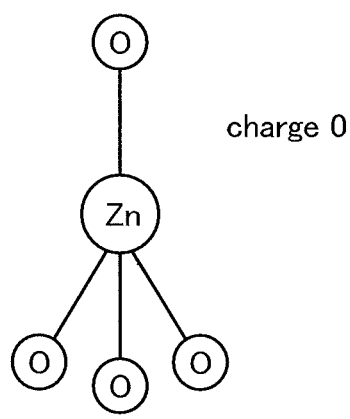

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A has three proximate In atoms in the downward direction, and the three O atoms in the lower half has three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the one tetracoordinate Zn atom in FIG. 18C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, a medium group can also be formed in a different manner by combining a plurality of small groups so that the total electric charge of the layered structure is 0.

FIG. 19A illustrates a model of a medium group included in a layered structure of an In—Sn—Zn-based oxide. FIG. 19B illustrates a large group including three medium groups. FIG. 19C illustrates an atomic arrangement where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, a crystal of an In—Sn—Zn—based oxide ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide such as an In-based oxide, a Sn-based oxide, or a Zn-based oxide; and the like.

Figure 20A:
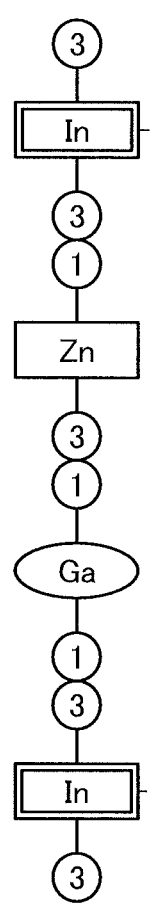
FIGS. 20A to 20C illustrate a crystal structure of an oxide semiconductor.

For example, FIG. 20A illustrates a model of a medium group included in a layered structure of an In—Ga—Zn-based oxide.

In the medium group included in the layered structure of the In—Ga—Zn-based oxide in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
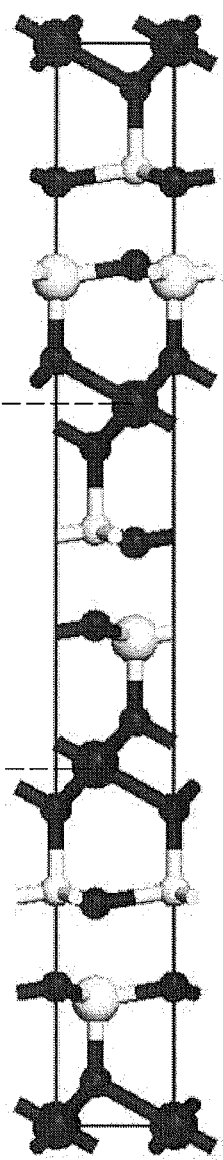
Figure 20C:
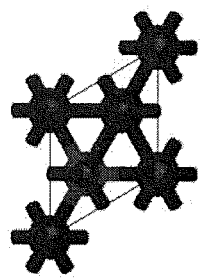

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 20A but also a medium group in which the arrangement of the In atom, the Ga atom, and the Zn atom is different from that in FIG. 18A.

When the large group illustrated in FIG. 20B is repeated, a crystal of an In—Ga—Zn-based oxide can be obtained. Note that a layered structure of the obtained In—Ga—Zn—O-based crystal can be expressed as a composition formula, $In_2GaO_3(ZnO)_n$ (n is a natural number).

Figure 21A:
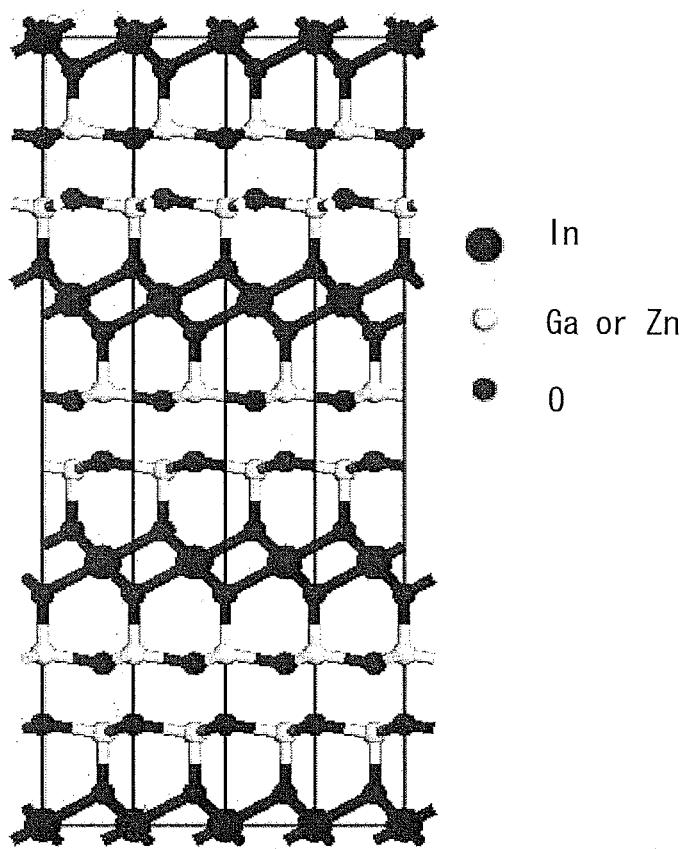
FIGS. 21A and 21B each illustrate a crystal structure of an oxide semiconductor.

In the case where n=1 ($InGaZnO_4$), a crystal structure illustrated in FIG. 21A can be obtained, for example. Note that in the crystal structure in FIG. 21A, since a Ga atom and an In atom each have five ligands as described in FIG. 18B, a structure in which Ga is replaced with In can be obtained.

Figure 21B:
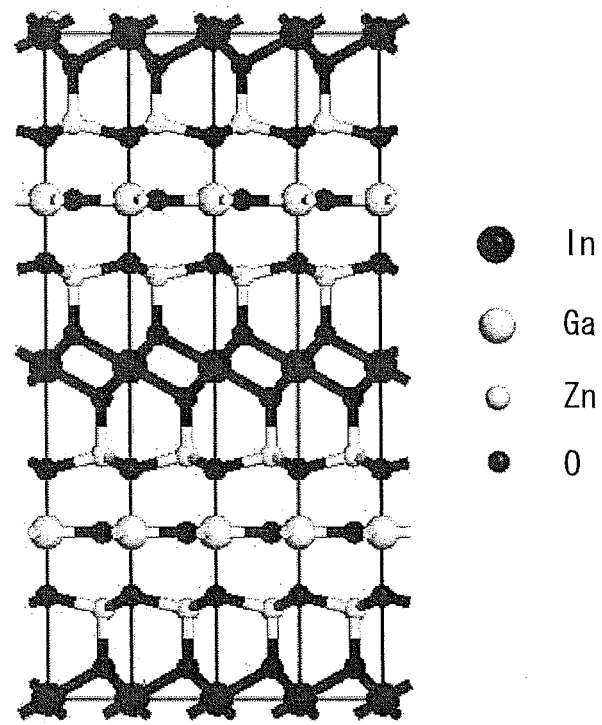

In the case where n=2 ($InGaZn_2O_5$), a crystal structure illustrated in FIG. 21B can be obtained, for example. Note that in the crystal structure in FIG. 21B, since a Ga atom and an In atom each have five ligands as described in FIG. 18B, a structure in which Ga is replaced with In can be obtained.

Further, the hydrogen concentration of the oxide semiconductor film 1106 is preferably lower than or equal to $5\times10^{19}$ atoms/cm$^3$, more preferably lower than or equal to $5\times10^{18}$ atoms/cm$^3$.

In the transistor illustrated in FIG. 10B, the low-resistance regions 1106b of the oxide semiconductor film 1106 can be formed in a self-aligned manner with the use of the gate electrode 1110 as a mask. Accordingly, a photolithography process for the low-resistance regions 1106b (and the high-resistance region 1106a which is formed at the same time as the low-resistance regions 1106b) can be omitted. Further, since there is substantially no overlap between the low-resistance region 1106b and the gate electrode 1110, parasitic capacitance due to the low-resistance region 1106b and the gate electrode 1110 is not generated, so that the transistor can operate at high speed. Note that in the high-resistance region 1106a, a channel is formed when voltage higher than or equal to the threshold voltage of the transistor is applied to the gate.

The transistor illustrated in FIG. 10B includes the sidewall insulating film 1112; accordingly, when the transistor operates, an electric field is applied from the pair of electrodes 1114 to the high-resistance region 1106a through the low-resistance regions 1106b. The low-resistance regions 1106b relaxes an electric field applied to the high-resistance region 1106a, so that deterioration such as hot carrier degradation can be suppressed even in a minute transistor with a short channel length, which can make the transistor highly reliable.

For the base insulating film 1102, an insulating film from which oxygen is released by heat treatment is preferably used. When a film that is in contact with the oxide semiconductor film 1106 is an insulating film from which oxygen is released by heat treatment, defects generated in the oxide semiconductor film 1106 and in the vicinity of the interface of the oxide semiconductor film 1106 can be repaired and deterioration in electric characteristics of the transistor can be suppressed.

The base insulating film 1102 is formed to have a single-layer structure or a layered structure, using at least one of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

To release oxygen by heat treatment means that the released amount of oxygen which is converted into oxygen atoms is greater than or equal to $1.0\times10^{18}$ atoms/cm$^3$ or greater than or equal to $3.0\times10^{20}$ atoms/cm$^3$ in thermal desorption spectroscopy (TDS) analysis.

Here, a method in which the amount of released oxygen is measured using TDS analysis will be described below.

The total amount of released gas in TDS analysis is proportional to the integral value of ion intensity of the released gas. Therefore, the total amount of released gas can be calculated from the ratio between the integral value of the measured ion intensity and the reference value of a standard sample.

For example, the amount of the released oxygen molecules ($N_{O2}$) from an insulating film can be found according to formula (2) with the TDS analysis results of a silicon wafer containing hydrogen at a predetermined density, which is the standard sample, and the TDS analysis results of the insulating film. Here, all gases having a mass number (or mass-to-charge ratio) of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

[FORMULA 2]

$$N_{O2} = \frac{N_{H2}}{S_{H2}} \times S_{O2} \times \alpha \quad (2)$$

The value $N_{H2}$ is obtained by conversion of the amount of hydrogen molecules desorbed from the standard sample into densities. The integral value of ion intensity when the standard sample is subjected to TDS analysis is denoted by $S_{H2}$. Here, the reference value of the standard sample is set to $N_{H2}/S_{H2}$. The integral value of ion intensity when the insulating film is subjected to TDS analysis is denoted by $S_{O2}$. A coefficient affecting the ion intensity in the TDS analysis is denoted by $\alpha$. Japanese Published Patent Application No. H6-275697 is to be referred to for details of formula 3. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/$cm^3$ as the standard sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can be estimated through the evaluation of the amount of the released oxygen molecules.

Note that the number of the released oxygen molecules is denoted by $N_{O2}$. The amount of released oxygen when converted into oxygen atoms is twice the number of the released oxygen molecules.

In the above structure, the film from which oxygen is released by heat treatment may be oxygen-excess silicon oxide ($SiO_X$(X>2)). In the oxygen-excess silicon oxide ($SiO_X$(X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 1102 to the oxide semiconductor film 1106, the interface state density at the interface between the oxide semiconductor film 1106 and the base insulating film 1102 can be decreased. As a result, carrier trapping due to an operation of the transistor or the like at the interface between the oxide semiconductor film 1106 and the base insulating film 1102 can be suppressed; thus, a transistor with less deterioration in electric characteristics can be obtained.

It is preferable that the protective insulating film 1104 is preferably a film through which oxygen does not pass even when heat treatment at a temperature higher than or equal to 250° C. and lower than or equal to 450° C., preferably higher than or equal to 150° C. and lower than or equal to 800° C. is performed for one hour, for example.

When the protective insulating film 1104 with such a property is provided to surround the base insulating film 1102, oxygen released from the base insulating film 1102 by heat treatment can be inhibited from diffusing toward the outside of the transistor. Accordingly, oxygen is kept in the base insulating film 1102, so that the electric characteristics and reliability of the transistor can be improved.

Note that a structure without the protective insulating film 1104 is not excluded.

The protective insulating film 1104 is formed to have a single-layer structure or a layered structure, using at least one of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

A flexible substrate may be used as the substrate 1100. In that case, a transistor is formed directly on the flexible substrate. As a method for forming a transistor on a flexible substrate, a method may be employed in which after the transistor is formed over a non-flexible substrate, the transistor is separated and transferred to the substrate 1100 that is a flexible substrate. In that case, a separation layer is preferably provided between the non-flexible substrate and the transistor.

The gate electrode 1110 is formed to have a single-layer structure or a layered structure, using at least one of the following materials: one of Al, Ti, Cr, Co, Ni, Cu, Y, Zr, Mo, Ag, Ta, and W; a nitride of any of these elements; an oxide of any of these elements; and an alloy of any of these elements. Note that the oxide film described as the material of the oxide semiconductor film 1106 may be used.

The gate insulating film 1108 can be formed using a method and a material similar to those of the base insulating film 1102.

The pair of electrodes 1114 can be formed using a method and a material similar to those of the gate electrode 1110.

The interlayer insulating film 1116 can be formed using a method and a material similar to those of the base insulating film 1102.

The wirings 1118 can be formed using a method and a material similar to those of the gate electrode 1110.

An example of a method for manufacturing the transistor illustrated in FIG. 10B is described below.

Here, it is preferable that all the films be deposited so that impurities such as hydrogen and water that adversely affect the characteristics of the transistor are not contained. For example, impurities adhering to a surface of the substrate 1100 or the like are taken in a film. It is thus preferable that impurities adhering to the surface of the substrate 1100 or the like be removed by performing heat treatment in a reduced-pressure atmosphere or an oxidizing atmosphere before deposition of each film. In addition, since impurities due to a deposition chamber become a problem, the impurities are also preferably removed in advance. Specifically, it is preferable that the deposition chamber be subjected to baking so that removal of a gas from the inside of the deposition chamber is promoted and the deposition chamber is evacuated. In addition, before deposition of each film, approximately five-minute dummy deposition for approximately 100 dummy substrates is preferably performed. Note that it is more preferable that the film formation chamber be evacuated every time dummy film formation for a dummy substrate is performed. Here, dummy deposition means deposition performed on a dummy substrate by sputtering or the like. Through dummy deposition, a film is deposited on a dummy substrate and the inner wall of the deposition chamber, so that impurities in the deposition chamber and an adsorbate existing on the inner wall of the deposition chamber can be enclosed in the film. For the dummy substrate, a material from which a less amount of gas is released is preferably used, and for example, a material which is similar to that of the substrate 1100 may be used. By performing dummy film formation, impurity concentration in a film to be deposited later can be reduced.

Since the purity of a gas used for deposition also influences the impurity concentration in the film, the purity of the gas is preferably as high as possible. When a sputtering method is employed, for example, an argon gas having a purity of 9N (dew point: −121° C., water concentration: 0.1 ppb, hydrogen concentration: 0.5 ppb) and an oxygen gas having a purity of 8N (dew point: −112° C., water concentration: 1 ppb, hydrogen concentration: 1 ppb) is used.

Figure 13A:
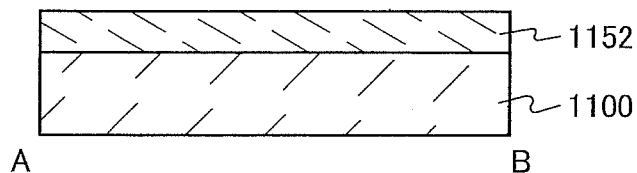
FIGS. 13A to 13F illustrate steps of manufacturing a transistor.

First, a base insulating film 1152 is deposited over the substrate 1100 by a sputtering method, an evaporation method, a PCVD method, a PLD method, an ALD method, an MBE method, or the like (see FIG. 13A).

Figure 13B:
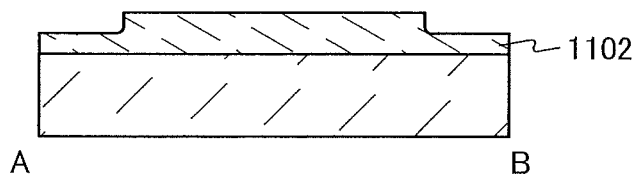

Next, the base insulating film 1152 is processed by a photolithography process or the like, so that the base insulating film 1102 is formed (see FIG. 13B).

Figure 13C:
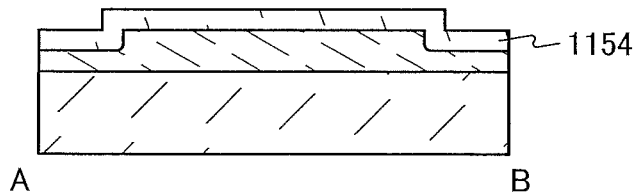

After that, a protective insulating film 1154 is deposited by a sputtering method, an evaporation method, a PCVD (plasma-enhanced CVD) method, a PLD (pulsed laser deposition) method, an ALD (atomic layer deposition) method, an MBE (molecular beam epitaxy) method, or the like (see FIG. 13C).

Figure 13D:
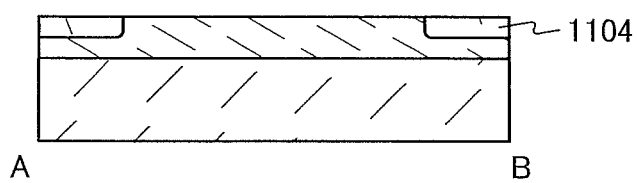

Then, by chemical mechanical polishing (CMP) treatment, the protective insulating film 1104 whose surface is level with that of the base insulating film 1102 is formed (see FIG. 13D). Note that the surface of the base insulating film 1102 and that of the protective insulating film 1104 is at substantially the same level.

Figure 13E:
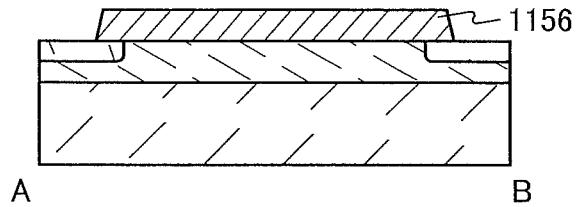

Next, an oxide semiconductor film is formed and is processed by a photolithography process or the like, so that an oxide semiconductor film 1156 is formed (see FIG. 13E). By heat treatment which is performed at this time, oxygen is supplied from the base insulating film 1102 to the oxide semiconductor film.

First, an oxide semiconductor film is deposited over the flat substrate 1100 by a sputtering method, an evaporation method, a PCVD method, a PLD method, an ALD method, an MBE method, or the like. The oxide semiconductor film 1156 is deposited preferably by a sputtering method in an oxygen gas atmosphere at a substrate heating temperature higher than or equal to 100° C. and lower than or equal to 600° C., preferably higher than or equal to 150° C. and lower than or equal to 550° C., and further preferably higher than or equal to 200° C. and lower than or equal to 500° C. The thickness of the oxide semiconductor film 1156 is greater than or equal to 1 nm and less than or equal to 40 nm, preferably greater than or equal to 3 nm and less than or equal to 20 nm. As the substrate heating temperature at the time of deposition is higher, the impurity concentration of the obtained oxide semiconductor film 1156 is lower. In addition, an atomic arrangement in the oxide semiconductor film 1156 is ordered, and the density thereof is increased, so that a polycrystalline oxide semiconductor film or a CAAC-OS film is easily formed. Furthermore, when an oxygen gas atmosphere is employed for the deposition, an unnecessary atom such as a rare gas atom is not contained in the oxide semiconductor film 1156, so that a polycrystalline oxide semiconductor film or a CAAC-OS film is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. As the oxide semiconductor film 1156 is thinner, the short channel effect of the transistor can be reduced. However, when the oxide semiconductor film 1156 is too thin, the oxide semiconductor film 1156 is significantly influenced by interface scattering; thus, the field-effect mobility might be decreased.

In the case where a film of an In—Ga—Zn—O-based material is deposited as the oxide semiconductor film 1156 by a sputtering method, it is preferable to use an In—Ga—Zn—O target having an atomic ratio of In:Ga:Zn=1:1:1, 4:2:3, 3:1:2, 1:1:2, 2:1:3, or 3:1:4. When the oxide semiconductor film 1156 is deposited using an In—Ga—Zn—O target having the above atomic ratio, a polycrystalline oxide semiconductor film or a CAAC-OS film is easily formed.

In the case where a film of an In—Sn—Zn—O-based material is deposited as the oxide semiconductor film 1156 by a sputtering method, it is preferable to use an In—Sn—Zn—O target having an atomic ratio of In:Sn:Zn=1:1:1, 2:1:3, 1:2:2, or 20:45:35. When the oxide semiconductor film 1156 is deposited using an In—Sn—Zn—O target having the above atomic ratio, a polycrystalline oxide semiconductor film or CAAC-OS film is easily formed.

Next, heat treatment is performed on the substrate 1100. The heat treatment is performed in a reduced-pressure atmosphere, an inert atmosphere, or an oxidizing atmosphere. By the heat treatment, the impurity concentration in the oxide semiconductor film 1156 can be reduced.

The heat treatment is preferably performed in such a manner that after heat treatment is performed in a reduced-pressure atmosphere or an inert atmosphere, the atmosphere is switched to an oxidizing atmosphere with the temperature maintained and heat treatment is further performed. When the heat treatment is performed in a reduced-pressure atmosphere or an inert atmosphere, the impurity concentration in the oxide semiconductor film 1156 can be reduced; however, oxygen vacancies are caused at the same time. By the heat treatment in the oxidizing atmosphere, the caused oxygen vacancies can be reduced.

By performing heat treatment in addition to the substrate heating at the time of deposition on the oxide semiconductor film 1156, the impurity level in the film can be significantly reduced. Accordingly, the field-effect mobility of the transistor can be increased to be close to ideal field-effect mobility to be described later.

The heat treatment is performed at a temperature, for example, higher than or equal to 200° C. and lower than the strain point of the substrate, and is preferably performed at a temperature higher than or equal to 250° C. and lower than or equal to 450° C. The heat treatment is performed in an oxidizing atmosphere, an inert atmosphere, or a reduced-pressure atmosphere (10 Pa or lower), but the atmosphere is not limited thereto. The treatment time is 3 minutes to 24 hours. As the treatment time is increased, the proportion of a crystal region with respect to that of an amorphous region in the oxide semiconductor film can be increased. Note that heat treatment for longer than 24 hours is not preferable because the productivity is reduced.

The oxidizing atmosphere is an atmosphere containing an oxidizing gas. Oxidizing gas is oxygen, ozone, nitrous oxide, or the like, and it is preferable that the oxidizing gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). As the oxidizing atmosphere, an oxidizing gas and an inert gas may be mixed to be used. In that case, the mixture contains an oxidizing gas at a concentration of greater than or equal to 10 ppm.

Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

For the heat treatment, a rapid thermal anneal (RTA) apparatus can be used. With the use of the RTA apparatus, only in a short time, the heat treatment can be performed at a temperature higher than or equal to the strain point of the substrate. Therefore, the time to form an oxide semiconductor film in which the proportion of a crystal region with respect to that of an amorphous region is high can be shortened.

Note that electric characteristics of a transistor which uses an amorphous In—Sn—Zn—O-based oxide in an active layer have been reported, where a field-effect mobility of 30 $cm^2/Vs$ has been achieved (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW '10, pp. 631-634).

Figure 13F:
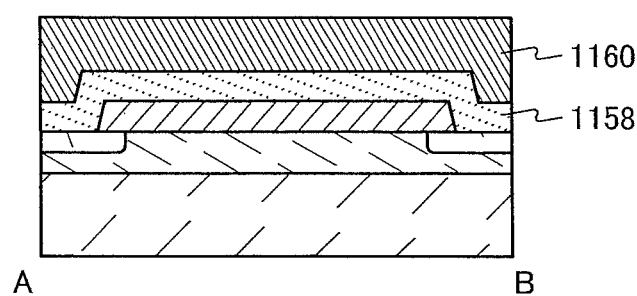

Next, an insulating film 1158 and a conductive film 1160 are deposited in this order (see FIG. 13F). As a method for depositing these films, any of a sputtering method, an evaporation method, a PCVD method, a PLD method, an ALD method, an MBE method, and the like is employed.

Figure 14A:
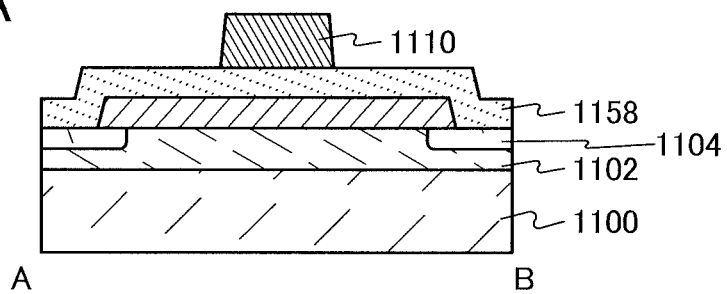
FIGS. 14A to 14D illustrate steps of manufacturing a transistor.

Then, the conductive film 1160 is processed by a photolithography process or the like, so that the gate electrode 1110 is formed (see FIG. 14A).

Figure 14B:
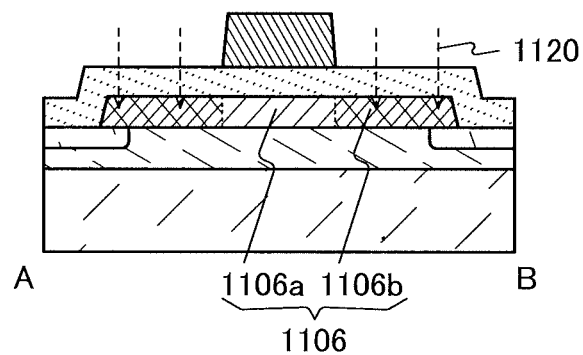

Next, with the use of the gate electrode 1110 as a mask, an impurity 1120 having a function of reducing the resistance of the oxide semiconductor film 1156 is added through the insulating film 1158, so that the oxide semiconductor film 1106 including the high-resistance region 1106a and the low-resistance regions 1106b is formed (see FIG. 14B). Note that phosphorus, nitrogen, boron, or the like is used as the impurity 1120. After addition of the impurity 1120, heat treatment at a temperature higher than or equal to 250° C. and lower than or equal to 650° C. may be performed. Note that the impurity 1120 is preferably added by an ion implantation method because, in such a case, less hydrogen is added to the oxide semiconductor film 1106 as compared to the case where the impurity 1120 is added by an ion doping method. Note that the use of an ion doping method is not excluded.

Note that by addition of the impurity 1120 through the insulating film 1158, damage caused at the time of addition of the impurity 1120 to the oxide semiconductor film 1106 can be reduced.

Figure 14C:
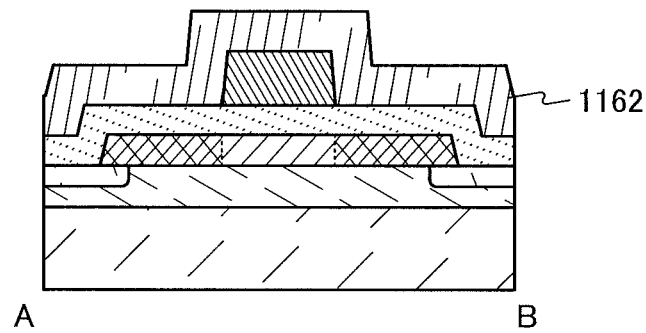

Next, an insulating film 1162 is deposited by a sputtering method, an evaporation method, a PCVD method, a PLD method, an ALD method, an MBE method, or the like (see FIG. 14C).

Then, the insulating film 1162 is etched, so that the sidewall insulating film 1112 is formed. The etching here is a highly anisotropic etching step, and the sidewall insulating film 1112 can be formed in a self-aligned manner by performing the highly anisotropic etching step on the insulating film 1162. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas, for example. A rare gas such as helium (He) or argon (Ar) or hydrogen ($H_2$) may be added to the etching gas. In addition, as the dry etching, a reactive ion etching (RIE) method in which high-frequency voltage is applied to a substrate is preferably employed.

Figure 14D:
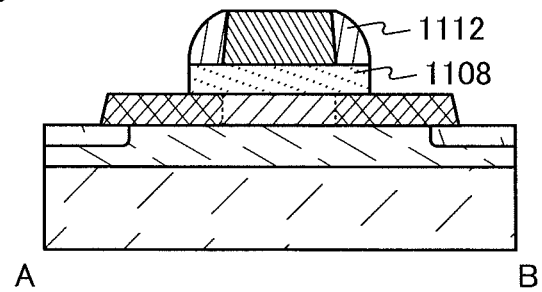

While the sidewall insulating film 1112 is formed, the gate insulating film 1108 can be formed by processing the insulating film 1158 (see FIG. 14D).

Figure 15A:
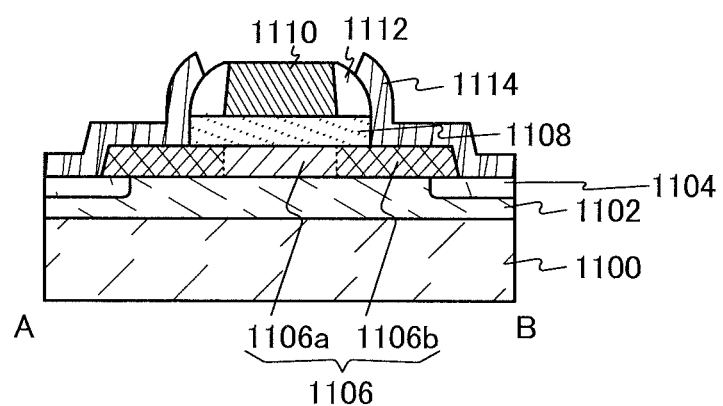
FIGS. 15A and 15B illustrate a step of manufacturing a transistor.

Next, a conductive film is deposited by a sputtering method, an evaporation method, a PCVD method, a PLD method, an ALD method, an MBE method, or the like and processed by a photolithography process or the like, so that the pair of electrodes 1114 are formed (see FIG. 15A).

Figure 15B:
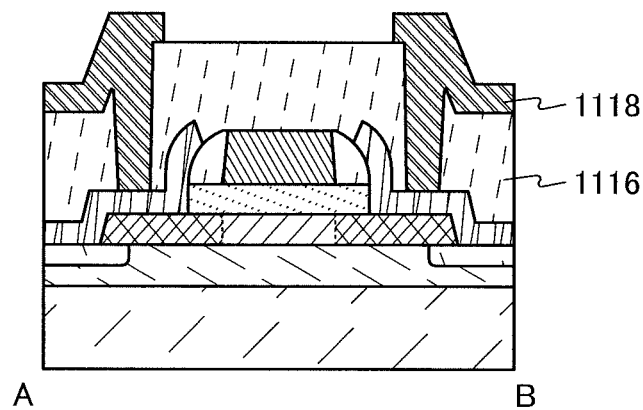

Then, the interlayer insulating film 1116 is formed by a sputtering method, an evaporation method, a PCVD method, a PLD method, an ALD method, an MBE method, or the like, and openings for exposure of the pair of electrodes 1114 are provided. After that, a conductive film is deposited by a sputtering method, an evaporation method, a PCVD method, a PLD method, an ALD method, an MBE method, or the like and processed by a photolithography process or the like, so that the wirings 1118 which are in contact with the pair of electrodes 1114 are formed (see FIG. 15B). Note that for the interlayer insulating film 1116, it is preferable to use an aluminum oxide film at least part of which has a thickness of greater than or equal to 20 nm, preferably greater than or equal to 50 nm, more preferably greater than or equal to 100 nm. When an aluminum oxide film is used, entry of impurities from the outside of the transistor, which adversely affect the electric characteristics of the transistor, can be suppressed. Further, outward diffusion of oxygen released from the base insulating film 1102 from the transistor can be suppressed. To achieve these advantageous effects, although depending on the quality of the aluminum oxide film, the aluminum oxide film needs to have some thickness. However, making the thickness of an aluminum oxide film too large leads a reduction in productivity; thus, an appropriate thickness can be selected.

Through the above-described process, the transistor illustrated in FIGS. 10A and 10B can be manufactured.

Figure 11A:
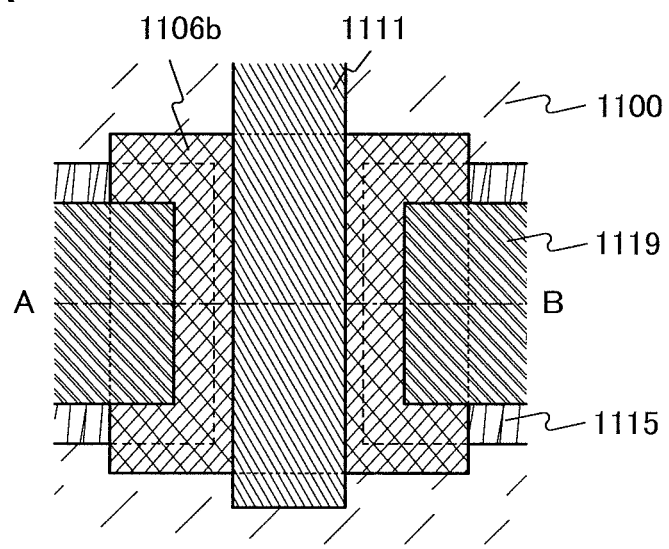
FIGS. 11A and 11B illustrate a structure of a transistor.
Figure 11B:
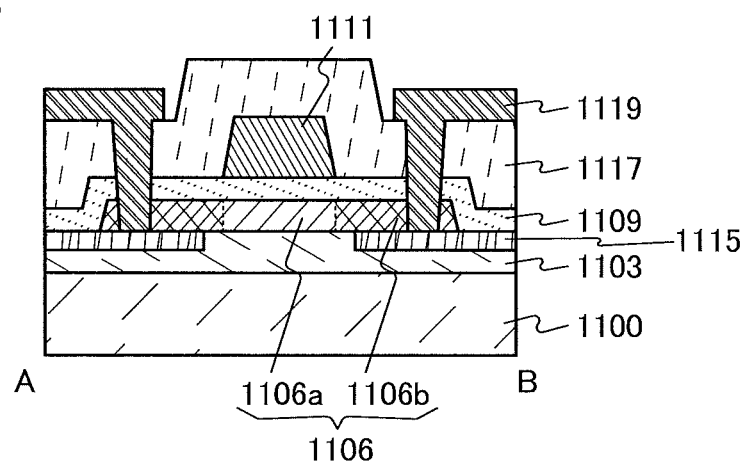

FIGS. 11A and 11B are a top view and a cross-sectional view of a coplanar transistor having a top-gate top-contact structure, which is another example of the transistor including an oxide semiconductor. FIG. 11A is the top view of the transistor, and FIG. 11B illustrates a cross-section A-B taken along the dashed-dotted line A-B in FIG. 11A.

The transistor illustrated in FIG. 11B includes the substrate 1100, a base insulating film 1103 provided over the substrate 1100, a pair of electrodes 1115 provided in groove portions of the base insulating film 1103, an oxide semiconductor film 1106 which includes a high-resistance region 1106a and low-resistance regions 1106b and which is provided over the base insulating film 1103 and the pair of electrodes 1115, a gate insulating film 1109 provided over the oxide semiconductor film 1106, and a gate electrode 1111 provided to overlap with the high-resistance region 1106a with the gate insulating film 1109 provided therebetween. The transistor may include an interlayer insulating film 1117 which is provide to cover the transistor, and wirings 1119 connected to the pair of electrodes 1115 through openings provided in the interlayer insulating film 1117, the gate insulating film 1109, and the oxide semiconductor film 1106.

Note that the base insulating film 1103, the gate insulating film 1109, the gate electrode 1111, the pair of electrodes 1115, the interlayer insulating film 1117, and the wirings 1119 can be respectively formed using methods and materials similar to those of the base insulating film 1102, the gate insulating film 1108, the gate electrode 1110, the pair of electrodes 1114, the interlayer insulating film 1116, and the wirings 1118.

The transistor illustrated in FIG. 11B is different from the transistor illustrated in FIG. 10B in that the pair of electrodes 1115 are in contact with lower portions of the oxide semiconductor film 1106. This structure is preferable in the case where the oxide semiconductor film 1106 is formed thin (e.g., in the case where the oxide semiconductor film 1106 is formed to a thickness of 5 nm or less) or the like, because part of the oxide semiconductor film 1106 is not exposed to plasma or a chemical solution at the time of formation of the pair of electrodes 1115.

An example of a method for manufacturing the transistor illustrated in FIG. 11B is described below.

Figure 16A:
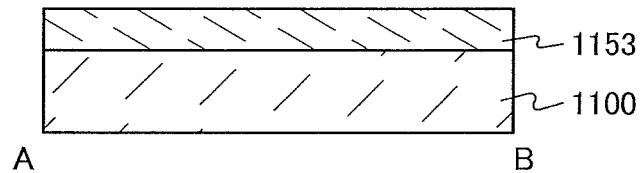
FIGS. 16A to 16F illustrate steps of manufacturing a transistor.

First, a base insulating film 1153 is deposited over the substrate 1100 (see FIG. 16A).

Figure 16B:
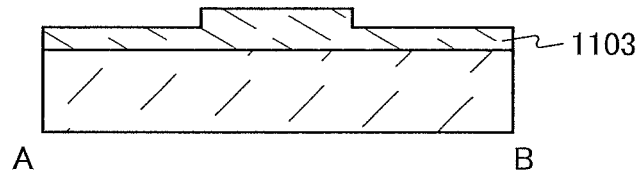

Next, the base insulating film 1153 is processed, so that the base insulating film 1103 is formed (see FIG. 16B).

Figure 16C:
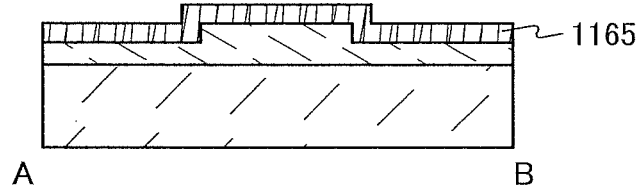

Then, a conductive film 1165 is deposited (see FIG. 16C).

Figure 16D:
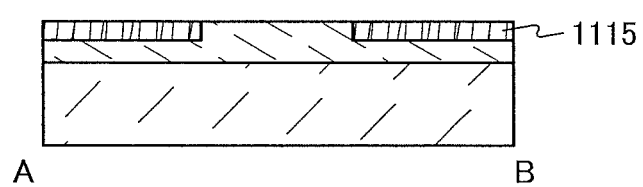

Then, CMP treatment is performed, so that the pair of electrodes 1115 whose surfaces are level with that of the base insulating film 1103 is formed (see FIG. 16D).

Figure 16E:
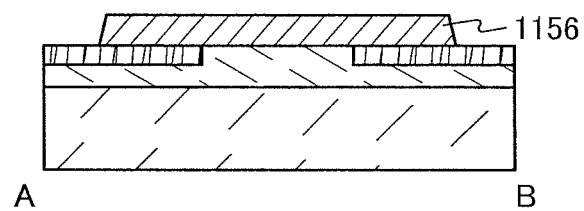

Next, the oxide semiconductor film 1156 is formed (see FIG. 16E).

Figure 16F:
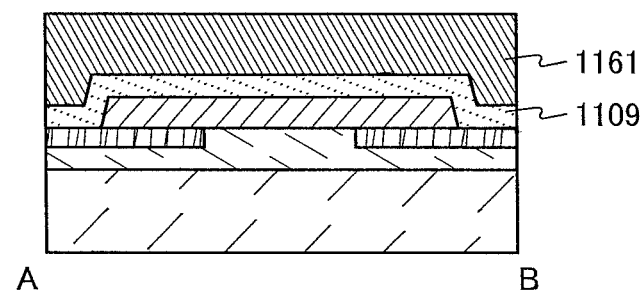

Then, the gate insulating film 1109 and a conductive film 1161 are deposited in this order (see FIG. 16F).

Figure 17A:
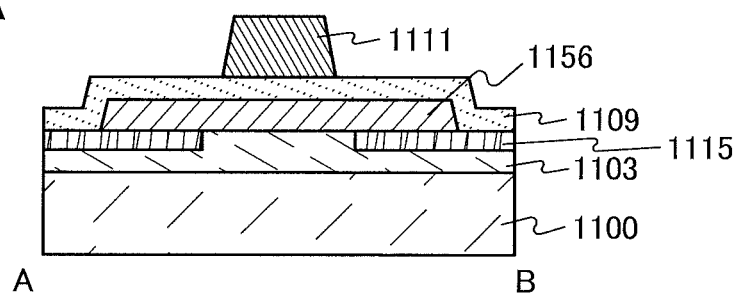
FIGS. 17A to 17C illustrate steps of manufacturing a transistor.

Then, the conductive film 1161 is processed, so that the gate electrode 1111 is formed (see FIG. 17A).

Figure 17B:
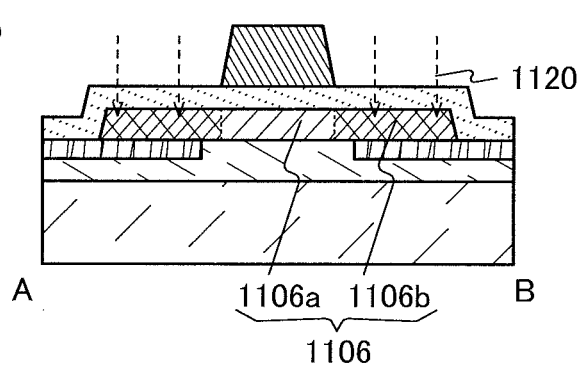

Next, with the use of the gate electrode 1111 as a mask, the impurity 1120 having a function of reducing the resistance of the oxide semiconductor film 1156 is added through the gate insulating film 1109, so that the oxide semiconductor film 1106 including the high-resistance region 1106a and the low-resistance regions 1106b is formed (see FIG. 17B).

Figure 17C:
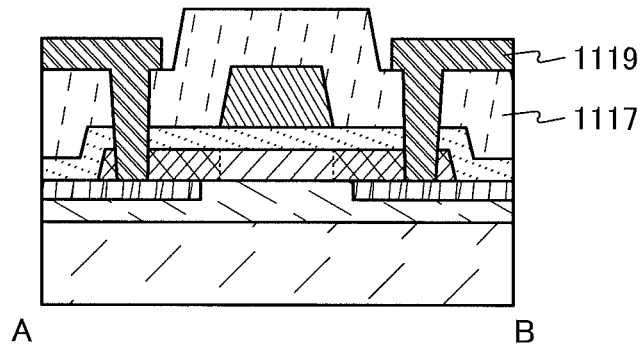

Then, the interlayer insulating film 1117 is deposited and the openings for exposure of the pair of electrodes 1115 are provided. Then, a conductive film is deposited and processed, so that the wirings 1119 which are in contact with the pair of electrodes 1115 are formed (see FIG. 17C).

Through the above-described process, the transistor illustrated in FIGS. 11A and 11B can be manufactured.

Figure 12A:
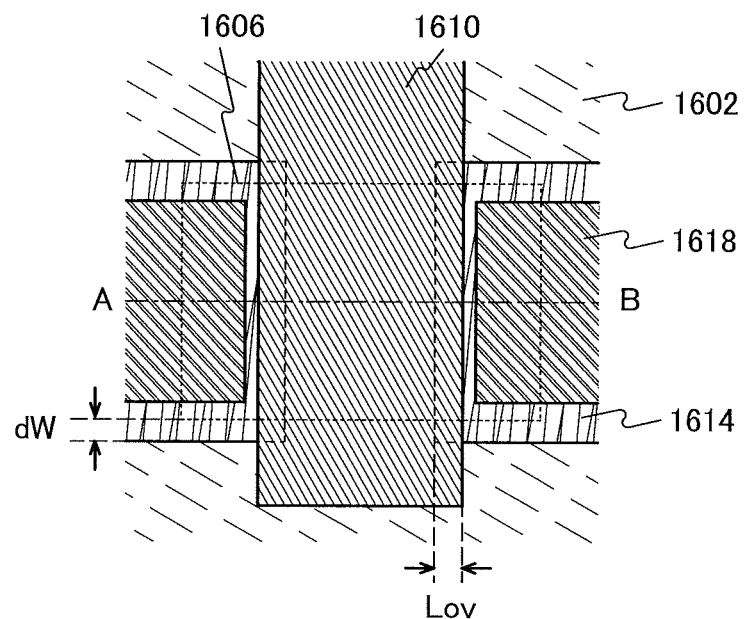
FIGS. 12A and 12B illustrate a structure of a transistor.
Figure 12B:
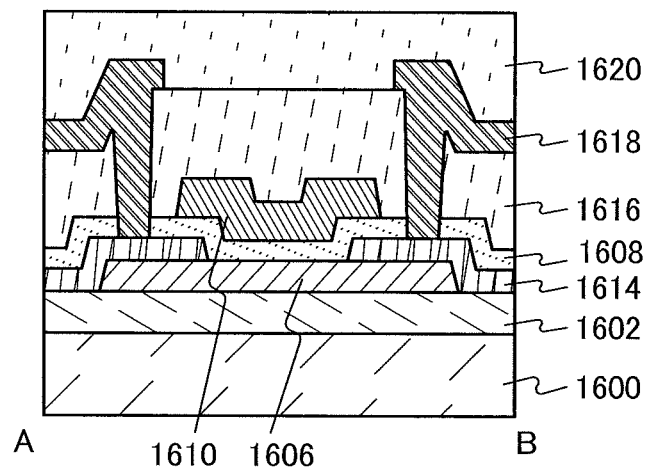

FIGS. 12A and 12B are a top view and a cross-sectional view of another example of the transistor including an oxide semiconductor. FIG. 12A is the top view of the transistor, and FIG. 12B illustrates a cross-section A-B taken along the dashed-dotted line A-B in FIG. 12A.

The transistor illustrated in FIG. 12B includes a substrate 1600, a base insulating film 1602 provided over the substrate 1600, an oxide semiconductor film 1606 provided over the base insulating film 1602, a pair of electrodes 1614 in contact with the oxide semiconductor film 1606, a gate insulating film 1608 provided over the oxide semiconductor film 1606 and the pair of electrodes 1614, a gate electrode 1610 provided to overlap with the oxide semiconductor film 1606 with the gate insulating film 1608 provided therebetween, an interlayer insulating film 1616 provided to cover the gate insulating film 1608 and the gate electrode 1610, wirings 1618 connected to the pair of electrodes 1614 through openings formed in the interlayer insulating film 1616, and a protective film 1620 provided to cover the interlayer insulating film 1616 and the wirings 1618.

As the substrate 1600, a glass substrate is used. As the base insulating film 1602, a silicon oxide film is used. As the oxide semiconductor film 1606, an In—Sn—Zn-based oxide film is used. As the pair of electrodes 1614, a tungsten film is used. As the gate insulating film 1608, a silicon oxide film is used. The gate electrode 1610 has a layered structure of a tantalum nitride film and a tungsten film. The interlayer insulating film 1616 has a layered structure of a silicon oxynitride film and a polyimide film. The wirings 1618 each have a layered structure in which a titanium film, an aluminum film, and a titanium film are formed in this order. As the protective film 1620, a polyimide film is used.

Note that in the transistor having the structure illustrated in FIG. 12A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

Since the oxide semiconductor film is used for each transistor in FIGS. 10A and 10B, FIGS. 11A and 11B, and FIGS. 12A and 12B, a transistor having high field-effect mobility and high reliability can be obtained.

Calculation results of the field-effect mobility of a transistor including an oxide semiconductor, which is used according to one embodiment of the present invention, will be described here.

The actually measured field-effect mobility of an insulated gate transistor can be lower than its intrinsic field-effect mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the intrinsic field-effect mobility and the measured field-effect mobility of a semiconductor are $\mu_0$ and $\mu$, respectively, and a potential barrier (such as a grain boundary) exists in the semiconductor, the measured field-effect mobility is expressed by the following formula (3).

[FORMULA 3]

$$\mu = \mu_0 \exp\left(-\frac{E}{kT}\right) \quad (3)$$

Here, the height of the potential barrier is denoted by E, the Boltzmann constant is denoted by k, and the absolute temperature is denoted by T. When the potential barrier is assumed to be attributed to a defect, the height of the potential barrier is expressed by the following formula (4) according to the Levinson model.

[FORMULA 4]

$$E = \frac{e^2 N^2}{8\varepsilon n} = \frac{e^3 N^2 t}{8\varepsilon C_{ox} V_g} \quad (4)$$

Here, the elementary charge is denoted by e, the average defect density per unit area in a channel is denoted by N, the permittivity of the semiconductor is denoted by $\varepsilon$, the number of carriers per unit area in the channel is denoted by n, the capacitance per unit area is denoted by $C_{ox}$, the gate voltage is denoted by $V_g$, and the thickness of the channel is denoted by t. In the case where the thickness of the semiconductor layer is less than or equal to 30 nm, the thickness of the channel may be regarded as being the same as the thickness of the semiconductor layer. The drain current $I_d$ in a linear region is expressed by the following formula (5).

[FORMULA 5]

$$I_d = \frac{W\mu V_g V_d C_{ox}}{L}\exp\left(-\frac{E}{kT}\right) \quad (5)$$

Here, the channel length is denoted by L and the channel width is denoted by W, and the channel length L and the channel width W are each 10 μm. In addition, the drain voltage is denoted by $V_d$. When dividing both sides of the above equation by $V_g$ and then taking logarithms of both sides, the following formula (6) can be obtained.

[FORMULA 6]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (6)$$

The right side of Formula (6) is a function of $V_g$. From the formula, it is found that the defect density N can be obtained from the slope of a line in which $\ln(I_d/V_g)$ is the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}$/cm$^2$.

On the basis of the defect density obtained in this manner, or the like, $\mu_0$ can be calculated to be 120 cm$^2$/Vs from Formula (4) and Formula (5). The measured field-effect mobility of an In—Sn—Zn-based oxide including a defect is approximately 40 cm$^2$/Vs. However, assuming that no defect exists inside the semiconductor and at the interface between the semiconductor and an insulating film, the field-effect mobility $\mu_0$ of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed by the following formula (7).

[FORMULA 7]

$$\frac{1}{\mu_1} = \frac{1}{\mu_0} + \frac{D}{B}\exp\left(-\frac{x}{l}\right) \quad (7)$$

Here, the electric field in the gate direction is denoted by D, and constants are denoted by B and l. The constants B and l can be obtained from actual measurement results, and according to the above measurement results, the constant B is 4.75× 10$^7$ cm/s and the constant l is 10 nm (the depth to which the influence of interface scattering reaches). When the electric field D is increased (i.e., when the gate voltage is increased), the second term of Formula (7) is increased, so that the field-effect mobility $\mu_1$ is decreased.

Figure 22:
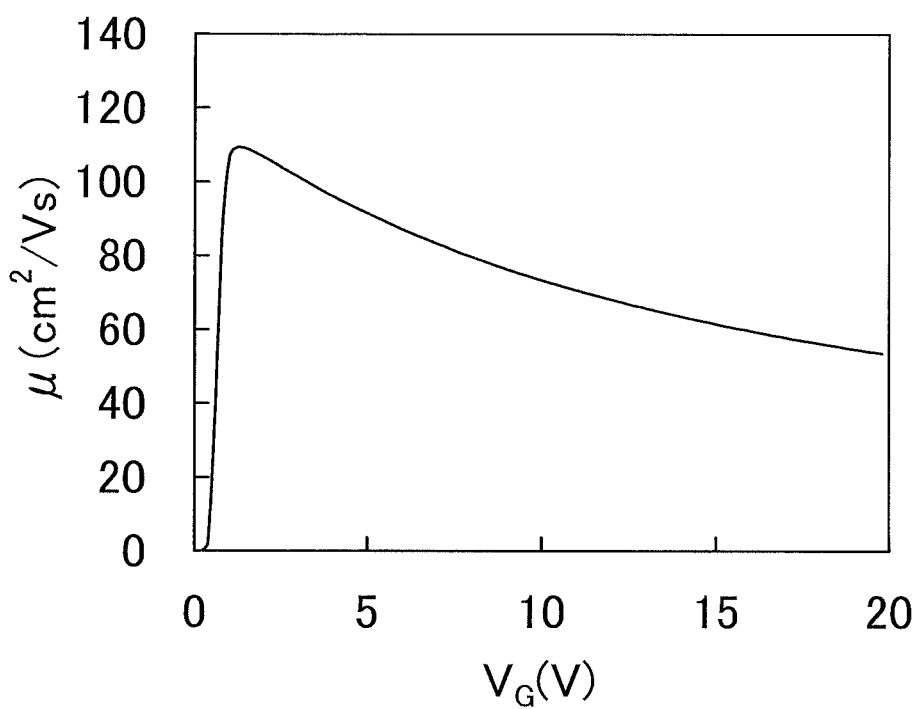
FIG. 22 shows gate voltage dependence of field-effect mobility obtained by calculation.

Calculation results of the field-effect mobility $\mu_2$ of an ideal transistor having a channel including an oxide semiconductor without a defect inside the semiconductor are shown in FIG. 22. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 22, the field-effect mobility has a peak of 100 cm$^2$/Vs or more at a gate voltage that is a little over 1 V and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors formed using an oxide semiconductor having such a field-effect mobility are shown in FIGS. 23A to 23C, FIGS. 24A to 24C, and FIGS. 25A to 25C. FIGS. 26A and 26B illustrate cross-sectional structures of the transistors used for the calculation. The transistors illustrated in FIGS. 26A and 26B each include a semiconductor region 2103a and a semiconductor region 2103c which have n$^+$-type conductivity type in an oxide semiconductor layer. The resistivity of the semiconductor region 2103a and the resistivity of the semiconductor region 2103c are each $2\times10^{-3}$ Ωcm.

The transistor in FIG. 26A is formed over a base insulator 2101 and an embedded insulator 2102 that is embedded in the base insulator 2101 and formed of aluminum oxide. The transistor includes the semiconductor region 2103a, the semiconductor region 2103c, an intrinsic semiconductor region 2103b that is placed between the semiconductor regions 2103a and 2103c and serves as a channel formation region, and a gate 2105. The width of the gate 2105 is 33 nm.

A gate insulator 2104 is formed between the gate 2105 and the semiconductor region 2103b. A sidewall insulator 2106a and a sidewall insulator 2106b are formed on both side surfaces of the gate 2105, and an insulator 2107 is formed over the gate 2105 so as to prevent a short circuit between the gate 2105 and another wiring. The sidewall insulator has a width of 5 nm. A source 2108a and a drain 2108b are provided in contact with the semiconductor region 2103a and the semiconductor region 2103c, respectively. Note that the channel width of this transistor is 40 nm.

The transistor in FIG. 26B is the same as the transistor in FIG. 26A in that it is formed over the base insulator 2101 and the embedded insulator 2102 formed of aluminum oxide and that it includes the semiconductor region 2103a, the semiconductor region 2103c, the intrinsic semiconductor region 2103b provided therebetween, the gate 2105 having a width of 33 nm, the gate insulator 2104, the sidewall insulator 2106a, the sidewall insulator 2106b, the insulator 2107, the source 2108a, and the drain 2108b.

The difference between the transistor in FIG. 26A and the transistor in FIG. 26B is the conductivity type of semiconductor regions under the sidewall insulator 2106a and the sidewall insulator 2106b. In the transistor in FIG. 26A, the semiconductor regions under the sidewall insulator 2106a and the sidewall insulator 2106b are part of the semiconductor region 2103a having n$^+$-type conductivity and part of the semiconductor region 2103c having n$^+$-type conductivity, whereas in the transistor in FIG. 26B, the semiconductor regions under the sidewall insulator 2106a and the sidewall insulator 2106b are part of the intrinsic semiconductor region 2103b. In other words, there is a region with a width $L_{off}$ in which the gate 2105 does not overlap with the semiconductor region 2103a. This region is called an offset region, and the width $L_{off}$ is called an offset length. As is seen from the drawing, the offset length is equal to the width of the sidewall insulator 2106*a* (the sidewall insulator 2106*b*).

Figure 23A:
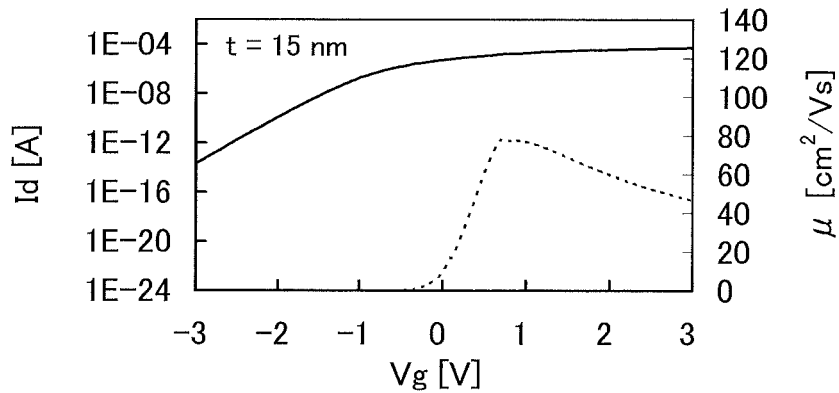
FIGS. 23A to 23C each show gate voltage dependence of drain current and field-effect mobility obtained by calculation.
Figure 23B:
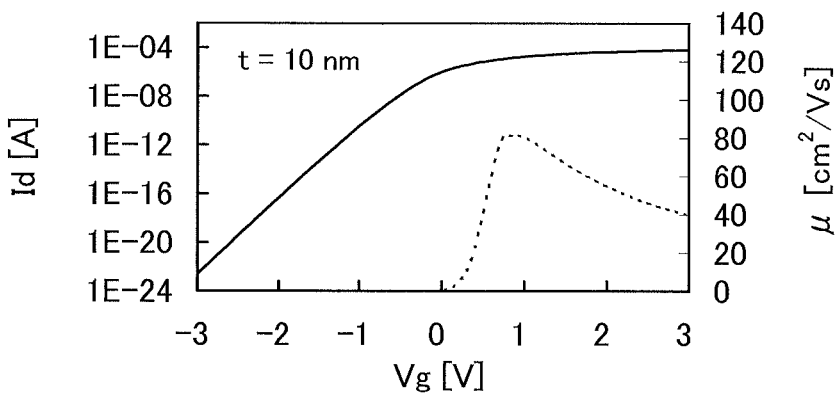
Figure 23C:
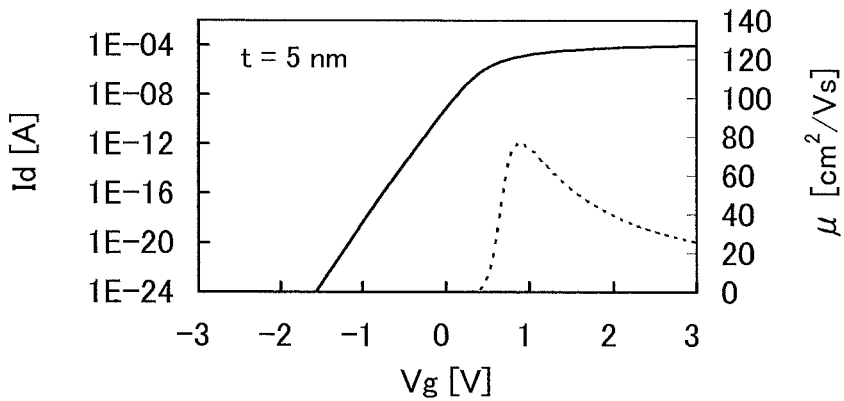

The other parameters used in calculation are as described above. For the calculation, device simulation software Sentaurus Device manufactured by Synopsys, Inc. was used. FIGS. 23A to 23C show the gate voltage ($V_g$: a potential difference between the gate and the source) dependence of the drain current ($I_d$, a solid line) and the field-effect mobility (μ, a dotted line) of the transistor having the structure illustrated in FIG. 26A. The drain current $I_d$ is obtained by calculation under the assumption that the drain voltage (a potential difference between the drain and the source) is +1 V, and the field-effect mobility μ is obtained by calculation under the assumption that the drain voltage is +0.1 V.

FIG. 23A shows the gate voltage dependence of the transistor in the case where the thickness of the gate insulator is 15 nm, FIG. 23B shows that of the transistor in the case where the thickness of the gate insulator is 10 nm, and FIG. 23C shows that of the transistor in the case where the thickness of the gate insulator is 5 nm. As the gate insulator is thinner, the drain current $I_d$ in the off state (the off-state current) in particular is significantly decreased. In contrast, there is no noticeable change in the peak value of the field-effect mobility μ and the drain current $I_d$ in the on state (the on-state current). The graphs show that the drain current exceeds 10 μA, which is required in a memory element and the like, at a gate voltage of around 1 V.

Figure 24A:
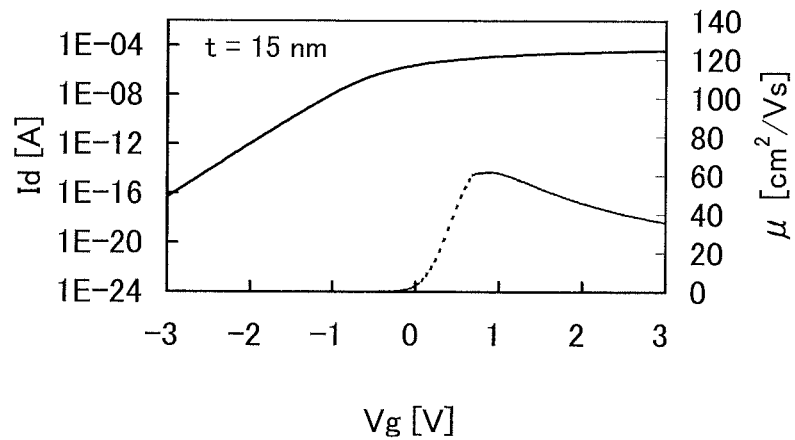
FIGS. 24A to 24C each show gate voltage dependence of drain current and field-effect mobility obtained by calculation.
Figure 24B:
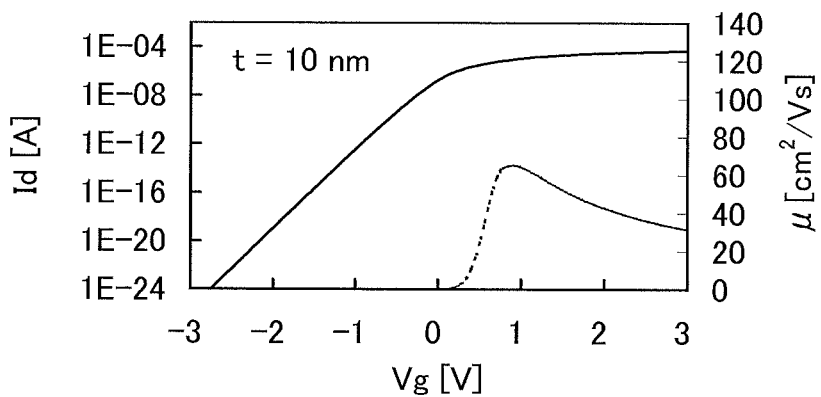
Figure 24C:
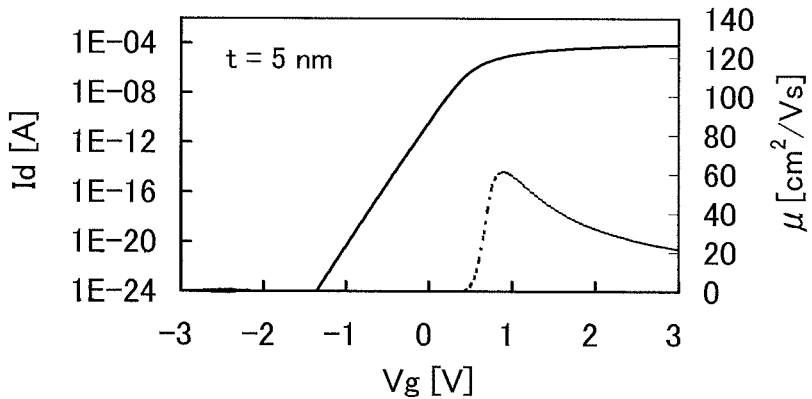

FIGS. 24A to 24C show the gate voltage $V_g$ dependence of the drain current $I_d$ (a solid line) and the field-effect mobility μ (a dotted line) of the transistor having the structure in FIG. 26B and an offset length $L_{off}$ of 5 nm. The drain current $I_d$ is obtained by calculation under the assumption that the drain voltage is +1 V and the field-effect mobility μ is obtained by calculation under the assumption that the drain voltage is +0.1 V. FIG. 24A shows the gate voltage dependence of the transistor in the case where the thickness of the gate insulator is 15 nm, FIG. 24B shows that of the transistor in the case where the thickness of the gate insulating layer is 10 nm, and FIG. 24C shows that of the transistor in the case where the thickness of the gate insulating layer is 5 nm.

Figure 25A:
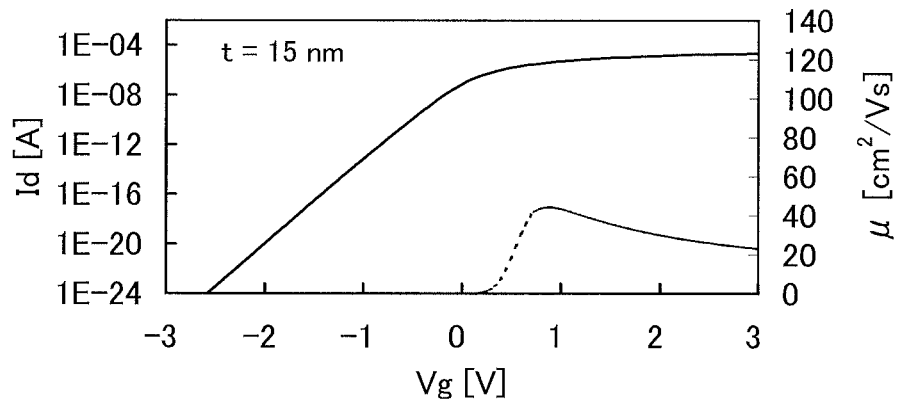
FIGS. 25A to 25C each show gate voltage dependence of drain current and field-effect mobility obtained by calculation.
Figure 25B:
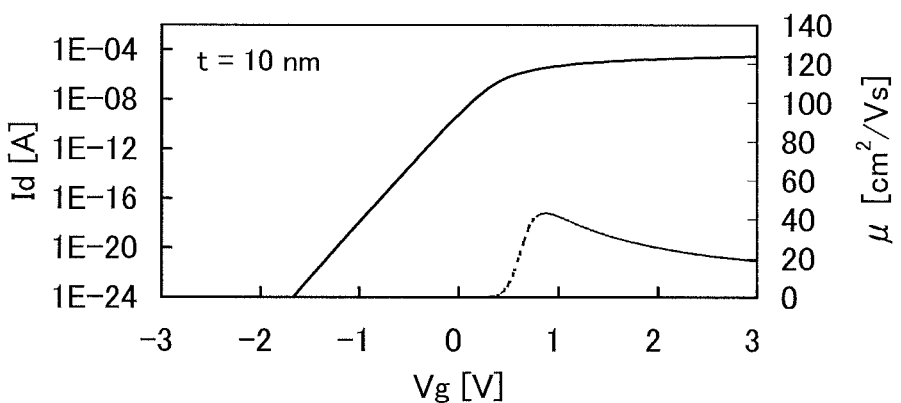
Figure 25C:
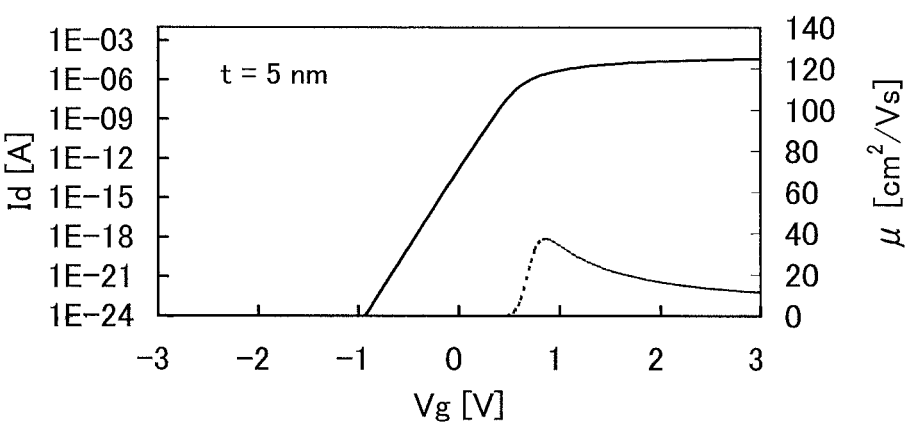

FIGS. 25A to 25C show the gate voltage dependence of the drain current $I_d$ (a solid line) and the field-effect mobility (a dotted line) of the transistor having the structure in FIG. 26B and an offset length $L_{off}$ of 15 nm. The drain current $I_d$ is obtained by calculation under the assumption that the drain voltage is +1 V and the field-effect mobility μ is obtained by calculation under the assumption that the drain voltage is +0.1 V. FIG. 25A shows the gate voltage dependence of the transistor in the case where the thickness of the gate insulator is 15 nm, FIG. 25B shows that of the transistor in the case where the thickness of the gate insulator is 10 nm, and FIG. 25C shows that of the transistor in the case where the thickness of the gate insulator is 5 nm.

In either of the structures, as the gate insulating film is thinner, the off-state current is significantly decreased, whereas no noticeable change arises in the peak value of the field-effect mobility μ and the on-state current.

Note that the peak of the field-effect mobility μ is approximately 80 cm²/Vs in FIGS. 23A to 23C, approximately 60 cm²/Vs in FIGS. 24A to 24C, and approximately 40 cm²/Vs in FIGS. 25A to 25C; thus, the peak of the field-effect mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Next, measurement results of the field-effect mobility of a transistor including an oxide semiconductor, which is used according to one embodiment of the present invention, will be described.

A transistor which includes an oxide semiconductor including In, Sn, and Zn in a channel formation region can have favorable characteristics by depositing the oxide semiconductor while heating a substrate or by performing heat treatment after an oxide semiconductor film is formed.

By intentionally heating the substrate after deposition of the oxide semiconductor film including In, Sn, and Zn, the field-effect mobility of the transistor can be improved.

Figure 27A:
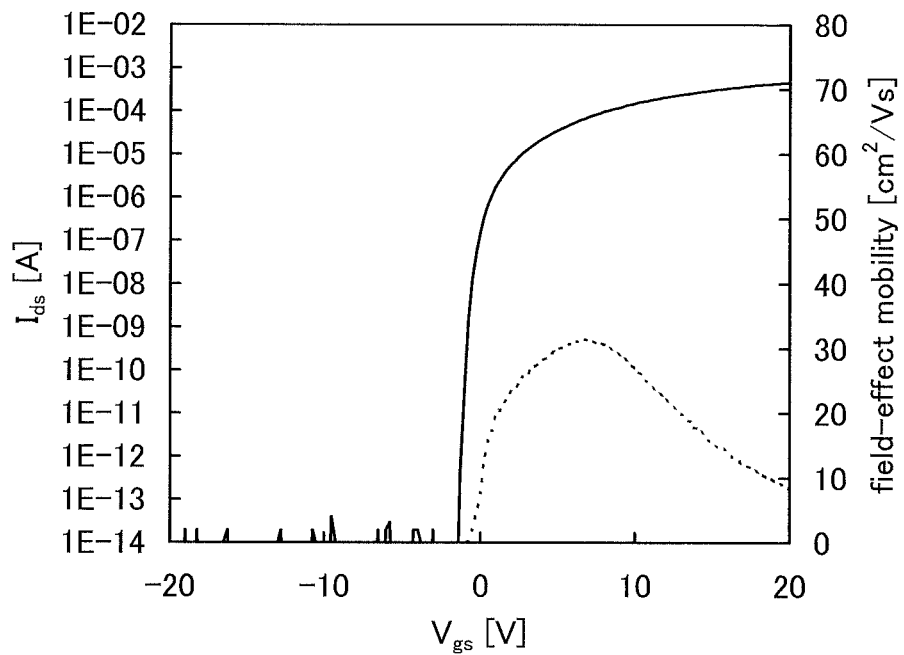
FIGS. 27A and 27B are graphs each showing characteristics of a transistor including an oxide semiconductor film.
Figure 27B:
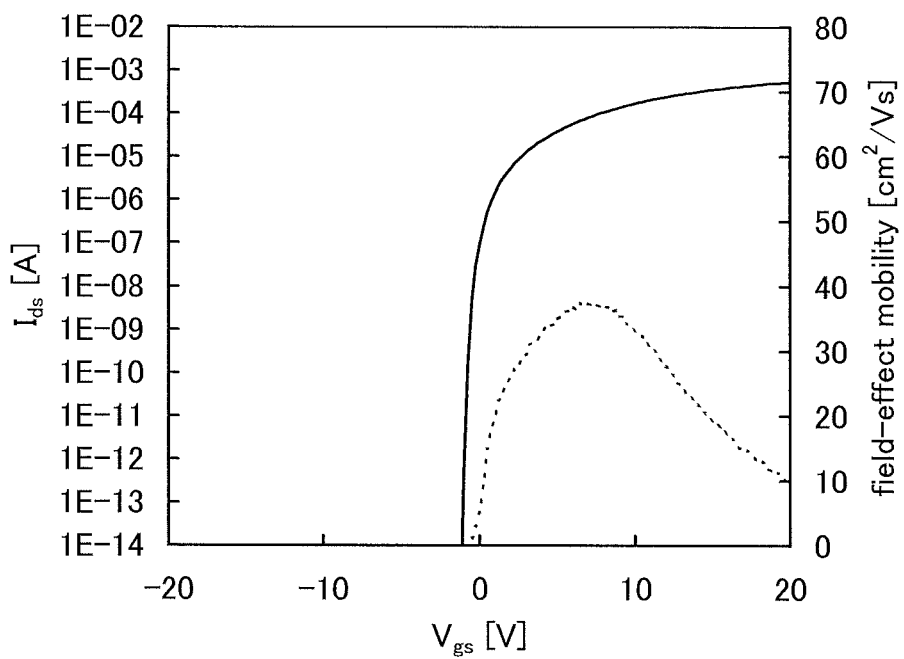

For example, FIGS. 27A and 27B each show characteristics of a transistor in FIGS. 12A and 12B, in which an oxide semiconductor film includes In, Sn, and Zn, a channel length L is 3 μm, a channel width W is 10 μm, and the thickness of a gate insulating film is 100 nm. Note that $V_d$ was set to 10 V.

FIG. 27A shows characteristics of a transistor whose oxide semiconductor film including In, Sn, and Zn was formed while heating a substrate at 200° C. The field-effect mobility of the transistor is 32.2 cm²/Vs.

The field-effect mobility can be further improved by performing heat treatment after the oxide semiconductor film including In, Sn, and Zn is formed. FIG. 27B shows characteristics of a transistor whose oxide semiconductor film including In, Sn, and Zn was deposited by sputtering at 200° C. and then subjected to heat treatment at 650° C. The field-effect mobility of the transistor is 34.5 cm²/Vs.

The following advantageous effect can be expected: the intentional heating of the substrate can reduce moisture taken into the oxide semiconductor film during the deposition by sputtering. Further, the heat treatment after deposition enables hydrogen, a hydroxyl group, or moisture to be released and removed from the oxide semiconductor film. In this manner, the field-effect mobility can be improved. It is presumed that such an improvement in field-effect mobility is achieved not only by removal of impurities by dehydration or dehydrogenation but also by a reduction in interatomic distance due to an increase in density. In addition, the oxide semiconductor can be crystallized by being purified by removal of impurities from the oxide semiconductor. In the case of using such a purified non-single-crystal oxide semiconductor, ideally, a field-effect mobility exceeding 100 cm²/Vs is expected to be realized.

The oxide semiconductor including In, Sn, and Zn may be crystallized in the following manner: oxygen ions are implanted into the oxide semiconductor; hydrogen, a hydroxyl group, or moisture included in the oxide semiconductor is released by heat treatment; and the oxide semiconductor is crystallized through the heat treatment or by another heat treatment performed later. By such crystallization treatment or recrystallization treatment, a non-single-crystal oxide semiconductor having favorable crystallinity can be obtained.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the advantageous effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancy is easily caused in the oxide semiconductor or at an interface with a film stacked therewith; when excess oxygen is included in the oxide semiconductor by the heat treatment, oxygen vacancy caused constantly can be compensated for with excess oxygen. The excess oxygen is mainly oxygen existing between lattices. When the concentration of oxygen is set in the range of $1 \times 10^{16}$ atoms/cm$^3$ to $2 \times 10^{20}$ atoms/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering, using a target having a composition ratio of In:Sn:Zn=1:1:1, without heating a substrate intentionally is analyzed by X-ray diffraction (XRD), a halo pattern is observed. This deposited oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for forming Sample A and Sample B will be described below.

An In—Sn—Zn-based oxide film with a thickness of 100 nm was deposited over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature during deposition was set at 200° C. A sample formed in this manner was used as Sample A.

Next, a sample formed by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 28:
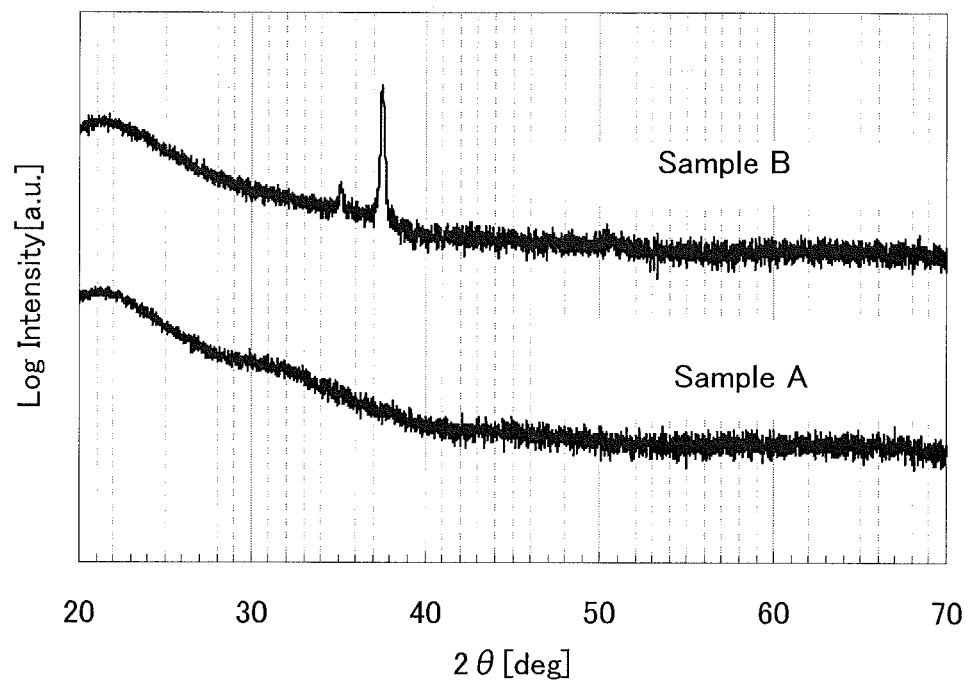
FIG. 28 is a graph showing XRD spectra of Sample A and Sample B.

FIG. 28 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn and/or by performing heat treatment after the deposition, characteristics of a transistor can be improved.

These substrate heating and heat treatment have an advantageous effect of preventing hydrogen and a hydroxyl group, which are unfavorable impurities for an oxide semiconductor, from being included in the film or an advantageous effect of removing hydrogen and a hydroxyl group from the film. That is, an oxide semiconductor can be purified by removing hydrogen serving as a donor impurity from the oxide semiconductor, whereby the off-state current of the transistor can be 1 aA/μm or lower by further supplying oxygen. Here, the unit of the off-state current represents current per micrometer of a channel width.

Figure 29:
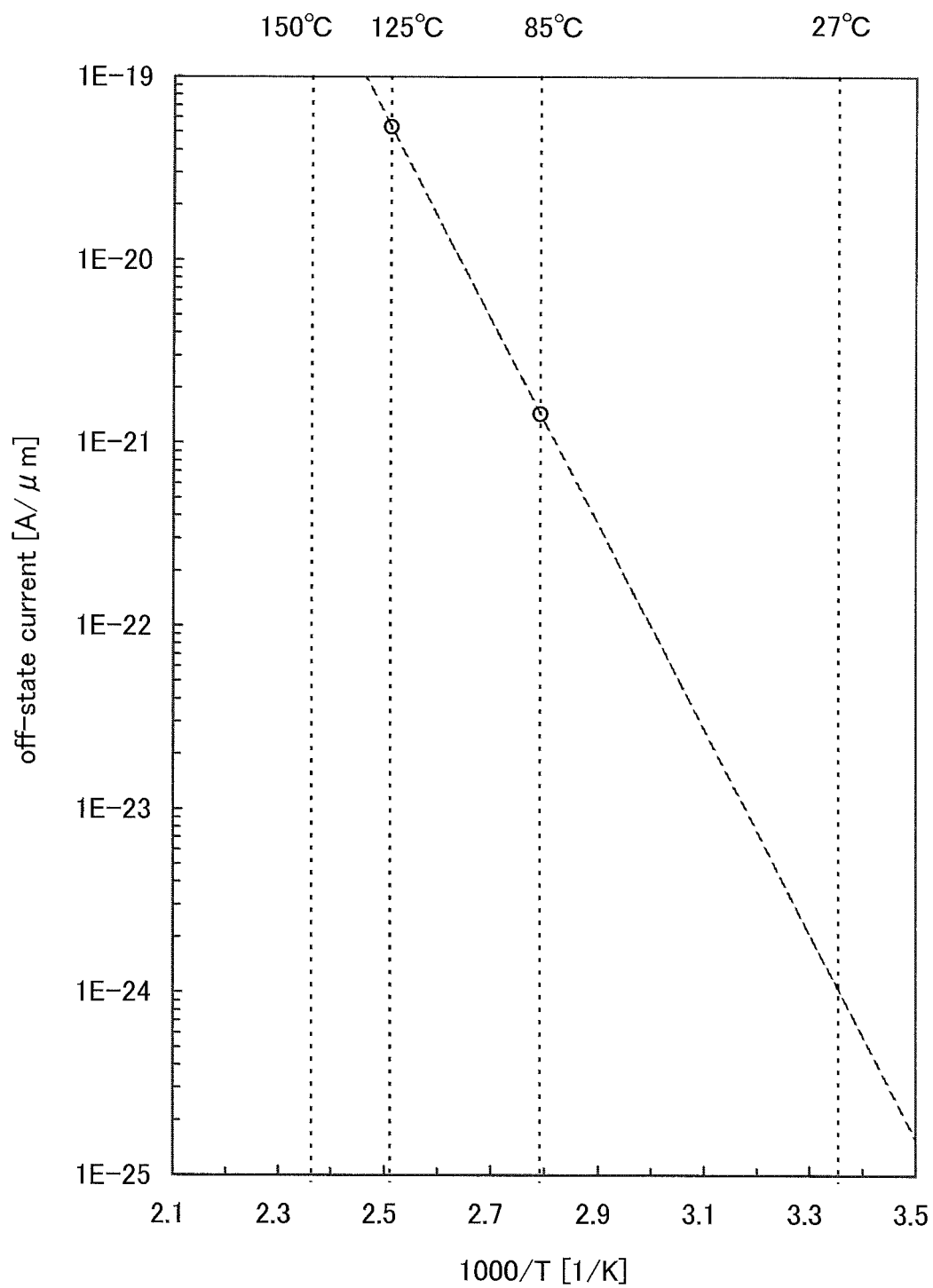
FIG. 29 is a graph showing a relation between the off-state current of a transistor and the substrate temperature in measurement.

Specifically, as shown in FIG. 29, the off-state current was lower than or equal to 0.1 aA/μm ($1 \times 10^{-19}$ A/μm), lower than or equal to 10 zA/μm ($1 \times 10^{-20}$ A/μm) when the substrate temperature was 125° C. or 85° C., respectively. The proportional relation between the logarithm of the off-state current and the inverse of the temperature suggests that the off-state current at room temperature (27° C.) is lower than or equal to 0.1 zA/μm ($1 \times 10^{-22}$ A/μm). Hence, the off-state current can be lower than or equal to 1 aA/μm ($1 \times 10^{-18}$ A/μm), lower than or equal to 100 zA/μm ($1 \times 10^{-19}$ A/μm), and lower than or equal to 1 zA/μm ($1 \times 10^{-21}$ A/μm) at 125° C., 85° C., and room temperature, respectively.

Note that in order to prevent hydrogen and moisture from being included in the oxide semiconductor film during deposition of the film, it is preferable to increase the purity of a sputtering gas by sufficiently suppressing leakage from the outside of a deposition chamber and degasification through an inner wall of the deposition chamber. For example, a gas with a dew point of lower than or equal to −70° C. is preferably used as the sputtering gas in order to prevent moisture from being included in the film. In addition, it is preferable to use a target that is highly purified so as not to include impurities such as hydrogen and moisture. Although it is possible to remove moisture from a film of an oxide semiconductor including In, Sn, and Zn as main components by heat treatment, a film that does not include moisture originally is preferably formed because moisture is released from the oxide semiconductor including In, Sn, and Zn at a higher temperature than from an oxide semiconductor including In, Ga, and Zn.

In a transistor in which such an oxide semiconductor including In, Sn, and Zn is used for a channel formation region, a field-effect mobility higher than or equal to 30 cm$^2$/Vs, preferably higher than or equal to 40 cm$^2$/Vs, further preferably higher than or equal to 60 cm$^2$/Vs can be obtained with the off-state current maintained at 1 aA/μm or lower, which can achieve on-state current needed for an LSI. For example, in an FET where L/W is 33 nm/40 nm, an on-state current higher than or equal to 12 μA can flow when the gate voltage is 2.7 V and the drain voltage is 1.0 V. In addition, sufficient electric characteristics can be ensured in a temperature range needed for the operation of a transistor. With such characteristics, an integrated circuit having a novel function can be realized without decreasing the operation speed even when a transistor including an oxide semiconductor is provided in an integrated circuit formed using a Si semiconductor.

This embodiment can be combined with any of the other embodiments as appropriate.

Embodiment 3

In this embodiment, a central processing unit (CPU) using an adder according to one embodiment of the present invention will be described with reference to FIG. 30.

Figure 30:
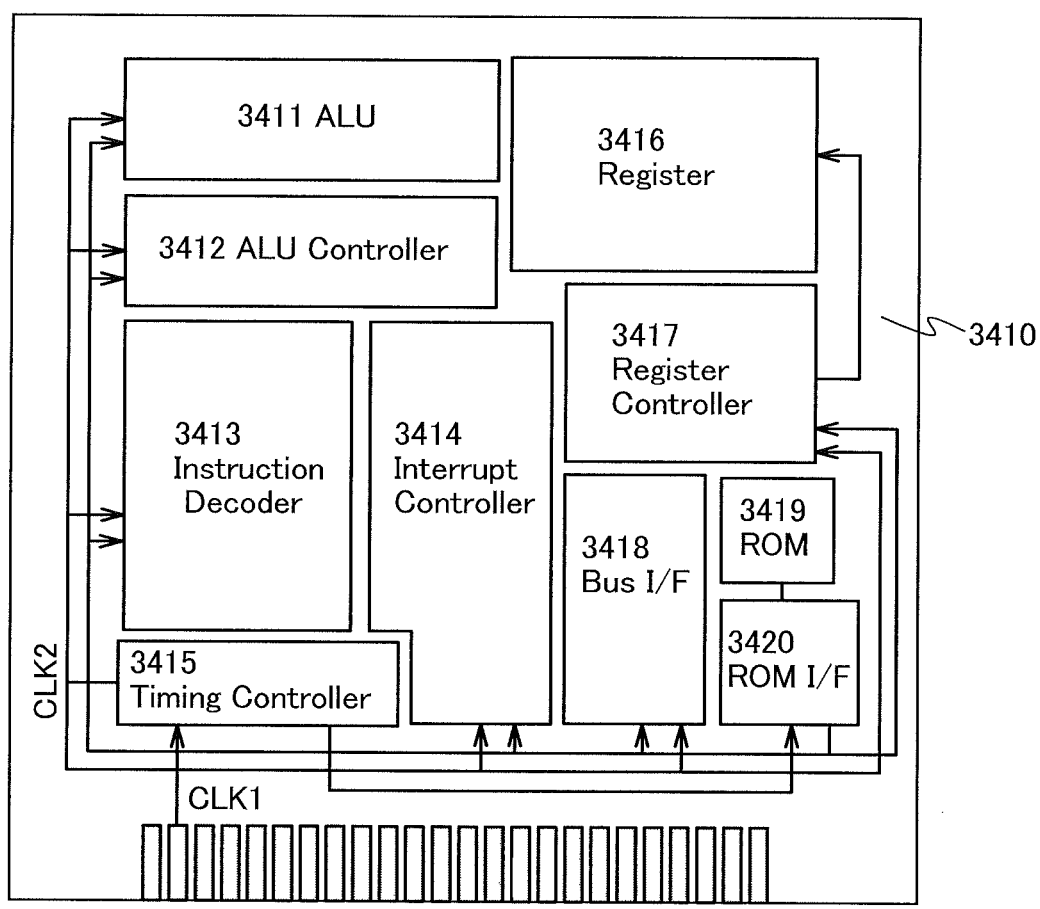
FIG. 30 is a block diagram of a CPU including an adder.

FIG. 30 illustrates a configuration of the CPU in this embodiment. The CPU illustrated in FIG. 30 mainly includes an arithmetic logic unit (ALU) 3411, an ALU controller 3412, an instruction decoder 3413, an interrupt controller 3414, a timing controller 3415, a register 3416, a register controller 3417, a bus interface (Bus I/F) 3418, a rewritable ROM 3419, and a ROM interface (ROM I/F) 3420, over a substrate 3410. Further, the ROM 3419 and the ROM I/F 3420 may be provided over different chips. Naturally, the CPU illustrated in FIG. 30 is only an example with a simplified configuration, and an actual CPU may employ a variety of configurations depending on the application.

An instruction which is input to the CPU through the Bus I/F 3418 is input to the instruction decoder 3413 and decoded therein, and then, input to the ALU controller 3412, the interrupt controller 3414, the register controller 3417, and the timing controller 3415.

The ALU controller 3412, the interrupt controller 3414, the register controller 3417, and the timing controller 3415 perform various controls based on the decoded instruction. Specifically, the ALU controller 3412 generates signals for controlling the operation of the ALU 3411. While the CPU is executing a program, the interrupt controller 3414 processes an interrupt request from an external input/output device or a peripheral circuit based on its priority or a mask state. The register controller 3417 generates an address of the register 3416, and reads/writes data from/to the register 3416 depending on the state of the CPU.

The timing controller 3415 generates signals for controlling operation timings of the ALU 3411, the ALU controller 3412, the instruction decoder 3413, the interrupt controller 3414, and the register controller 3417. For example, the timing controller 3415 is provided with an internal clock generator for generating an internal clock signal CLK2 on the basis of a reference clock signal CLK1, and supplies the clock signal CLK2 to the above circuits.

In the CPU of this embodiment, the adder having the architecture described in any of the above embodiments can be provided for the ALU 3411. When the adder described in any of the above embodiments is provided for the ALU 3411, even in the case where the operation of the CPU is temporarily stopped and the supply of the power supply voltage is stopped, data can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the adder according to one embodiment of the present invention is not limited to the CPU and can also be applied to an LSI such as a digital signal processor (DSP), a custom LSI, or a field programmable gate array (FPGA).

In particular, when to a portable electronic device which has difficulty in continuously receiving power, a signal processing circuit with low power consumption according to one embodiment of the present invention is added as a component of the device, an advantage in increasing the continuous operation time can be obtained.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can be provided with the signal processing circuit according to one embodiment of the present invention, mobile phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

This application is based on Japanese Patent Application serial No. 2011-114035 filed with the Japan Patent Office on May 20, 2011, the entire contents of which are hereby incorporated by reference.

What is claimed is:

1. A central processing unit comprising:
a register; and
an arithmetic logic unit comprising an adder, wherein the adder comprises:
  a sum circuit electrically connected to a first power supply line and a second power supply line;
  a first input terminal electrically connected to the sum circuit;
  a second input terminal electrically connected to the sum circuit;
  a third input terminal electrically connected to the sum circuit; and
  a first output terminal electrically connected to the sum circuit;
wherein the sum circuit comprises:
  a first transistor, one of a source and a drain of the first transistor is electrically connected to the first power supply line and the other of the source and the drain of the first transistor is electrically connected to the second power supply line; and
  a second transistor comprising a channel formation region comprising an oxide semiconductor layer, one of a source and a drain of the second transistor is electrically connected to the third input terminal and the other of the source and the drain of the second transistor is electrically connected to a gate of the first transistor, and
wherein the sum circuit is configured to output a high-potential signal from the first output terminal in accordance with an input of a high-potential signal to any one of the first input terminal, the second input terminal, and the third input terminal or high-potential signals to the first input terminal, the second input terminal, and the third input terminal.

2. The central processing unit according to claim 1, further comprising:
a first potential supply controller, wherein the sum circuit is electrically connected to the first power supply line through the first potential supply controller, and
a second potential supply controller, wherein the sum circuit is electrically connected to the second power supply line through the second potential supply controller.

3. The central processing unit according to claim 2,
wherein the first potential supply controller comprises a third transistor,
wherein one of a source and a drain of the third transistor is electrically connected to the sum circuit and the other of the source and the drain of the third transistor is electrically connected to the first power supply line,
wherein a gate of the third transistor is configured to be supplied with a clock signal,
wherein the second potential supply controller comprises a fourth transistor,
wherein one of a source and a drain of the fourth transistor is electrically connected to the sum circuit and the other of the source and the drain of the fourth transistor is electrically connected to the second power supply line, and
wherein a gate of the fourth transistor is configured to be supplied with the clock signal.

4. The central processing unit according to claim 2,
wherein the first potential supply controller comprises a third transistor,
wherein one of a source and a drain of the third transistor is electrically connected to the sum circuit and the other of the source and the drain of the third transistor is electrically connected to the first power supply line, wherein a gate of the third transistor is configured to be supplied with a clock signal, wherein the second potential supply controller comprises a fourth transistor, wherein one of a source and a drain of the fourth transistor is electrically connected to the sum circuit and the other of the source and the drain of the fourth transistor is electrically connected to the second power supply line, and wherein a gate of the fourth transistor is configured to be supplied with an inverted clock signal.

5. The central processing unit according to claim 1, wherein the oxide semiconductor layer comprises indium, gallium, and zinc.

6. The central processing unit according to claim 1, wherein the first transistor comprising a channel formation region comprising silicon.

7. A central processing unit comprising:
a register; and
an arithmetic logic unit comprising an adder, wherein the adder comprises:
  a sum circuit electrically connected to a first power supply line and a second power supply line;
  a carry circuit electrically connected to the first power supply line and the second power supply line;
  a first input terminal electrically connected to the sum circuit and the carry circuit;
  a second input terminal electrically connected to the sum circuit and the carry circuit;
  a third input terminal electrically connected to the sum circuit and the carry circuit;
  a first output terminal electrically connected to the sum circuit; and
  a second output terminal electrically connected to the carry circuit,
wherein each of the sum circuit and the carry circuit comprises:
  a first transistor, one of a source and a drain of the first transistor is electrically connected to the first power supply line and the other of the source and the drain of the first transistor is electrically connected to the second power supply line; and
  a second transistor comprising an oxide semiconductor layer, one of a source and a drain of the second transistor is electrically connected to the third input terminal and the other of the source and the drain of the second transistor is electrically connected to a gate of the first transistor,
wherein the sum circuit is configured to output a high-potential signal from the first output terminal in accordance with an input of a high-potential signal to any one of the first input terminal, the second input terminal, and the third input terminal or high-potential signals to the first input terminal, the second input terminal, and the third input terminal, and
wherein the carry circuit is configured to output a high-potential signal from the second output terminal in accordance with an input of high-potentials to any two or three of the first input terminal, the second input terminal, and the third input terminal.

8. The central processing unit according to claim 7, wherein the second output terminal is electrically connected to the third input terminal.

9. The central processing unit according to claim 7, further comprising:

a first potential supply controller, wherein the sum circuit is electrically connected to the first power supply line through the first potential supply controller, and a second potential supply controller, wherein the sum circuit is electrically connected to the second power supply line through the second potential supply controller.

10. The central processing unit according to claim 9, wherein the first potential supply controller comprises a third transistor, wherein one of a source and a drain of the third transistor is electrically connected to the sum circuit and the other of the source and the drain of the third transistor is electrically connected to the first power supply line, wherein a gate of the third transistor is configured to be supplied with a clock signal, wherein the second potential supply controller comprises a fourth transistor, wherein one of a source and a drain of the fourth transistor is electrically connected to the sum circuit and the other of the source and the drain of the fourth transistor is electrically connected to the second power supply line, and wherein a gate of the fourth transistor is configured to be supplied with the clock signal.

11. The central processing unit according to claim 9, wherein the first potential supply controller comprises a third transistor, wherein one of a source and a drain of the third transistor is electrically connected to the sum circuit and the other of the source and the drain of the third transistor is electrically connected to the first power supply line, wherein a gate of the third transistor is configured to be supplied with a clock signal, wherein the second potential supply controller comprises a fourth transistor, wherein one of a source and a drain of the fourth transistor is electrically connected to the sum circuit and the other of the source and the drain of the fourth transistor is electrically connected to the second power supply line, and wherein a gate of the fourth transistor is configured to be supplied with an inverted clock signal.

12. The central processing unit according to claim 7, further comprising:

a first potential supply controller, wherein the carry circuit is electrically connected to the first power supply line through the first potential supply controller, and a second potential supply controller, wherein the carry circuit is electrically connected to the second power supply line through the second potential supply controller.

13. The central processing unit according to claim 12, wherein the first potential supply controller comprises a third transistor, wherein one of a source and a drain of the third transistor is electrically connected to the carry circuit and the other of the source and the drain of the third transistor is electrically connected to the first power supply line, wherein a gate of the third transistor is configured to be supplied with a clock signal, wherein the second potential supply controller comprises a fourth transistor, wherein one of a source and a drain of the fourth transistor is electrically connected to the carry circuit and the other of the source and the drain of the fourth transistor is electrically connected to the second power supply line, and wherein a gate of the fourth transistor is configured to be supplied with the clock signal.

14. The central processing unit according to claim 12,
wherein the first potential supply controller comprises a third transistor,
wherein one of a source and a drain of the third transistor is electrically connected to the carry circuit and the other of the source and the drain of the third transistor is electrically connected to the first power supply line,
wherein a gate of the third transistor is configured to be supplied with a clock signal,
wherein the second potential supply controller comprises a fourth transistor,
wherein one of a source and a drain of the fourth transistor is electrically connected to the carry circuit and the other of the source and the drain of the fourth transistor is electrically connected to the second power supply line, and
wherein a gate of the fourth transistor is configured to be supplied with an inverted clock signal.

15. The central processing unit according to claim 7, wherein the oxide semiconductor layer comprises indium, gallium, and zinc.

16. The central processing unit according to claim 7, wherein the first transistor comprising a channel formation region comprising silicon.

17. A central processing unit comprising:
a register; and
an arithmetic logic unit comprising an adder, wherein the adder comprises:
 a carry circuit electrically connected to a first power supply line and a second power supply line;
 a first input terminal electrically connected to the carry circuit;
 a second input terminal electrically connected to the carry circuit;
 a third input terminal electrically connected to the carry circuit; and
 a first output terminal electrically connected to the carry circuit,
wherein the carry circuit comprises:
 a first transistor, one of a source and a drain of the first transistor is electrically connected to the first power supply line and the other of the source and the drain of the first transistor is electrically connected to the second power supply line;
 a second transistor comprising a channel formation region comprising an oxide semiconductor layer, one of a source and a drain of the second transistor is electrically connected to the third input terminal and the other of the source and the drain of the second transistor is electrically connected to a gate of the first transistor, and
wherein the carry circuit is configured to output a high-potential signal from the first output terminal in accordance with an input of high-potential signals to any two or three of the first input terminal, the second input terminal, and the third input terminal.

18. The central processing unit according to claim 17, wherein the first output terminal is electrically connected to the third input terminal.

19. The central processing unit according to claim 17, further comprising:
a first potential supply controller, wherein the carry circuit is electrically connected to the first power supply line through the first potential supply controller, and
a second potential supply controller, wherein the carry circuit is electrically connected to the second power supply line through the second potential supply controller.

20. The central processing unit according to claim 19,
wherein the first potential supply controller comprises a third transistor,
wherein one of a source and a drain of the third transistor is electrically connected to the carry circuit and the other of the source and the drain of the third transistor is electrically connected to the first power supply line,
wherein a gate of the third transistor is configured to be supplied with a clock signal,
wherein the second potential supply controller comprises a fourth transistor,
wherein one of a source and a drain of the fourth transistor is electrically connected to the carry circuit and the other of the source and the drain of the fourth transistor is electrically connected to the second power supply line, and
wherein a gate of the fourth transistor is configured to be supplied with the clock signal.

21. The central processing unit according to claim 19,
wherein the first potential supply controller comprises a third transistor,
wherein one of a source and a drain of the third transistor is electrically connected to the carry circuit and the other of the source and the drain of the third transistor is electrically connected to the first power supply line,
wherein a gate of the third transistor is configured to be supplied with a clock signal,
wherein the second potential supply controller comprises a fourth transistor,
wherein one of a source and a drain of the fourth transistor is electrically connected to the carry circuit and the other of the source and the drain of the fourth transistor is electrically connected to the second power supply line, and
wherein a gate of the fourth transistor is configured to be supplied with an inverted clock signal.

22. The central processing unit according to claim 17, wherein the oxide semiconductor layer comprises indium, gallium, and zinc.

23. The central processing unit according to claim 17, wherein the first transistor comprising a channel formation region comprising silicon.

* * * * *